(12) United States Patent
Ooishi

(10) Patent No.: US 6,999,341 B2
(45) Date of Patent: Feb. 14, 2006

(54) THIN-FILM MAGNETIC MEMORY DEVICE WITH MEMORY CELLS HAVING MAGNETIC TUNNEL JUNCTION

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 429 days.

(21) Appl. No.: 10/207,900

(22) Filed: Jul. 31, 2002

(65) Prior Publication Data

US 2003/0043620 A1 Mar. 6, 2003

(30) Foreign Application Priority Data

Sep. 4, 2001 (JP) ............................. 2001-267778

(51) Int. Cl.
*G11C 11/14* (2006.01)
(52) U.S. Cl. ..................... 365/171; 365/145; 365/158; 365/173; 365/230.7
(58) Field of Classification Search ................ 365/171, 365/145, 158, 173, 201, 209, 230.07
See application file for complete search history.

(56) References Cited

U.S. PATENT DOCUMENTS

| | | | |
|---|---|---|---|
| 5,193,074 A | 3/1993 | Anami | |
| 5,946,227 A | 8/1999 | Naji | |
| 6,191,972 B1 | 2/2001 | Miura et al. | |
| 6,331,943 B1 * | 12/2001 | Naji et al. | 365/158 |
| 6,335,890 B1 * | 1/2002 | Reohr et al. | 365/222.5 |
| 6,349,054 B1 * | 2/2002 | Hidaka | 365/173 |
| 6,490,217 B1 * | 12/2002 | Debrosse et al. | 365/225.5 |
| 6,567,299 B1 * | 5/2003 | Kunikiyo et al. | 365/173 |
| 6,741,513 B1 | 5/2004 | Honigschmid et al. | |
| 6,778,430 B1 * | 8/2004 | Hidaka | 365/171 |

FOREIGN PATENT DOCUMENTS

DE 100 54 520 C1 3/2002

OTHER PUBLICATIONS

Scheuerlein et al., "A 10ns Read and Write Non-Volatile Memory Array Using a Magnetic Tunnel Junction and FET Switch in Each Cell", ISSCC Digest of Technical Papers, TA7.2, Feb. 2000, pp. 94-95, 128-129, 409-410.

Durlam et al., "Nonvolatile RAM based on Magnetic Tunnel Junction Elements", ISSCC Digest of Technical Papers, TA7.3, Feb. 2000, pp. 96-97, 130-131, 410-411.

Scheuerlein, R., et al. "A 10ns Read and Write Non-Volatile Memory Array using a Magnetic Tunnel Junction and FET Switch in Each Cell." IEEE International Solid-State Circuits Conference, Feb. 7-9, 2000, pp. 128-129.

(Continued)

*Primary Examiner*—Connie C. Yoha
(74) *Attorney, Agent, or Firm*—McDermott Will & Emery LLP

(57) ABSTRACT

A memory array is divided into a plurality of memory cell blocks in m rows and n columns. A write digit line for each of the memory cell blocks is independent of those for the other memory cell blocks, and is divided corresponding to the memory cell rows. Each write digit line is selectively activated in accordance with information transmitted through a main word line and a segment decode line arranged hierarchically with respect to write digit line and commonly to a plurality of sub-blocks neighboring in the row direction. A data write current in the row direction is supplied only by the write digit line corresponding to the selected memory cell so that erroneous data writing into unselected memory cells can be suppressed.

18 Claims, 21 Drawing Sheets

OTHER PUBLICATIONS

Durlam, M., et al. "Non-volatile RAM based on magnetic tunnel junction elements." IEEE International Solid-State Circuits Conference, Feb. 7-9, 2000, pp. 130-131.

Tehrani, S., et al. "Progress and Outlook for MRAM Technology." IEEE Trans. Magn., pt. 1, vol. 35, Sep. 1999, pp. 2814-2819.

Naji, P.K., et al. " A 256 kb 3.0 V 1T1MTJ non-volatile magentoresistive RAM." IEEE International Solid-State Circuits Conference, Feb. 5-7, 2001, pp. 122-123. 438.

Itoh, K., et al. " Reviews and prospects of high-density RAM technology." International Semiconductor Conference, vol. 1, Oct. 10-14, 2000, pp. 13-22.

* cited by examiner

THIN-FILM MAGNETIC MEMORY DEVICE WITH MEMORY CELLS HAVING MAGNETIC TUNNEL JUNCTION

BACKGROUND OF THE INVENTION

1. Field of the Invention

The present invention relates to a thin-film magnetic memory device, and particularly to a random access memory provided with memory cells having MTJs (magnetic tunnel junctions)

2. Description of the Background Art

Attention is being given to an MRAM (Magnetic Random Access Memory) device as a memory device, which can nonvolatilely store data with a low power consumption. The MRAM device is a memory device, in which a plurality of thin-film magnetic members are formed in a semiconductor integrated circuit for nonvolatilely storing data, and random access to each thin-film magnetic member is allowed.

Particularly, in recent years, it has been announced that a performance of the MRAM device can be dramatically improved by using the thin-film magnetic members, which utilize the MTJs, as memory cells. The MRAM device with memory cells having the magnetic tunnel junction has been disclosed in technical references such as "A 10 ns Read and Write Non-Volatile Memory Array Using a Magnetic Tunnel Junction and FET Switch in each Cell", ISSCC Digest of Technical Papers, TA7.2, February 2000 and "Nonvolatile RAM based on Magnetic Tunnel Junction Elements", ISSCC Digest of Technical Papers, TA7.3, February 2000.

FIG. 21 conceptually shows a structure of a memory cell, which has a magnetic tunnel junction, and will also be referred to merely as an "MTJ memory cell" hereinafter.

Referring to FIG. 21, an MTJ memory cell MC includes a magnetic tunnel junction MTJ having an electric resistance, which is variable in accordance with a data level of storage data magnetically written thereinto, and an access transistor ATR. Access transistor ATR is connected in series to magnetic tunnel junction MTJ, and is arranged between a read bit line RBL and a write bit line WBL. A field-effect transistor is typically used as access transistor ATR.

For the MTJ memory cell, there are arranged write bit line WBL and a write digit line WDL for passing a data write current in a data write operation as well as a word line WL for instructing data reading and read bit line RBL for reading out storage data in a data read operation.

FIG. 22 shows a structure of the MTJ memory cell formed on a semiconductor substrate.

Referring to FIG. 22, access transistor ATR is formed on a semiconductor main substrate SUB. Access transistor ATR has source/drain regions 110 and 120 formed of n-type regions as well as a gate 130. Source/drain region 110 is electrically coupled to read bit line RBL via a metal film 140 formed in a contact hole.

Write digit line WDL is formed on a metal wiring layer at a higher level than read bit line RBL. Magnetic tunnel junction MTJ is electrically coupled to source/drain region 120 of access transistor ATR via metal film 140 formed in the contact hole, metal wiring layers and barrier metal 150. Barrier metal 150 is a buffer member provided for electrically coupling magnetic tunnel junction MTJ and the metal wiring.

Magnetic tunnel junction MTJ has a magnetic material layer, which has a fixed-magnetization direction, and will also be referred merely to as a "fixed-magnetic layer" hereinafter, and a magnetic material layer VL, which is magnetized in a direction depending on a data-write magnetic field caused by a data-write current, and will also be referred merely to as a "free-magnetic layer" hereinafter. A tunneling barrier TB formed of an insulator film is disposed between fixed-magnetic layer FL and free-magnetic layer VL. Free-magnetic layer VL is magnetized in the same direction as fixed-magnetic layer FL or in the opposite direction in accordance with the level of the storage data to be written.

Magnetic tunnel junction MTJ has an electric resistance, which is variable depending on a correlation in magnetization direction between fixed-magnetic layer FL and free-magnetic layer VL. More specifically, when the fixed-magnetic layer FL and free-magnetic layer VL are magnetized in the same parallel direction, the electric resistance is smaller than that in the case where these magnetic layers FL and VL are magnetized in the opposite (anti-parallel) directions, respectively.

Write bit line WBL is electrically coupled to magnetic tunnel junction MTJ, and is arranged at a higher level than magnetic tunnel junction MTJ. As will be described later in greater detail, it is necessary to pass the data write current through both of write bit line WBL and write digit line WDL in a data write operation. In a data read operation, however, word line WL is activated to carry a high voltage so that access transistor ATR is turned on, and magnetic tunnel junction MTJ is electrically coupled between read bit line RBL and write bit line WBL.

Write bit line WBL and write digit line WDL for passing a data write current as well as read bit line RBL for passing a sense current (data read current) are formed in metal wiring layers. Word line WL is provided for controlling a gate voltage of access transistor ATR, and it is not necessary to pass actively a current therethrough. Accordingly, for improving a density or degree of integration, word line WL is not formed in an independent or dedicated metal interconnection layer, but is formed in the same interconnection layer as gate 130 by using a polycrystalline silicon layer or a polycide layer.

FIG. 23 conceptually shows an operation of writing data in the MTJ memory cell.

Referring to FIG. 23, word line WL is inactive, and access transistor ATR is turned off in the data write operation. In this state, the data write currents for magnetizing free-magnetic layer VL in the direction depending on the level of the write data are supplied to write bit line WBL and write digit line WDL, respectively. The magnetization direction of free-magnetic layer VL depends on the directions of respective data write currents flowing through write bit line WBL and write digit line WDL.

FIG. 24 conceptually shows a relationship between the direction of the data write current and the magnetization direction of the free-magnetic layer.

Referring to FIG. 24, a magnetic field Hx given by an abscissa represents a direction of a magnetic field H(WDL) produced by the data write current flowing through write digit line WDL. A magnetic field Hy given by an ordinate represents a direction of magnetic field H(WBL) caused by the data write current flowing through write bit line WBL. The magnetization direction of free-magnetic layer VL is updated only when a sum of magnetic fields H(WDL) and H(WBL) is in a region outside an asteroid characteristic line depicted in FIG. 24. More specifically, it is necessary for executing the data writing to pass the data write currents, which are large enough to cause a magnetic field exceeding a predetermined intensity, through both write digit line WDL and write bit line WBL.

When a magnetic field corresponding to a region inside the asteroid characteristic line is applied, the magnetization direction of free-magnetic layer VL does not change. Thus, data writing is not executed when a predetermined data write current flows only through one of write digit line WDL and write bit line WBL. The magnetization direction, i.e., storage data level, which is once written into the MTJ memory cell, will be nonvolatilely held until new data writing is executed.

FIG. 25 conceptually shows the data read operation for the MTJ memory cell.

Referring to FIG. 25, access transistor ATR is turned on in response to activation of word line WL in the data read operation. Thereby, magnetic tunnel junction MTJ is electrically coupled between write bit line WBL and read bit line RBL. Further, a sense current Is is supplied to a current path including magnetic tunnel junction MTJ and read bit line RBL so that a voltage change corresponding to the electric resistance of magnetic tunnel junction MTJ and thus corresponding to the storage data level of the MTJ memory cell can occur on read bit line RBL.

For example, therefore, supply of sense current Is may start after precharging read bit line RBL to a predetermined voltage. Thereby, the storage data of MTJ memory cell can be read by detecting a voltage on read bit line RBL.

In the data read operation, sense current Is flows through magnetic tunnel junction MTJ. However, the sense current Is is generally determined to be smaller by one or two digits than the data write current already described. This reduces a possibility that sense current Is affects to rewrite erroneously the storage data of the MTJ memory cell in the data read operation.

In an MRAM device having a plurality of MTJ memory cells arranged in rows and columns, write digit line WDL and word line WL are generally arranged corresponding to each memory cell row, and write bit line WBL and read bit line RBL are generally arranged corresponding to each memory cell column. Therefore, two kinds of interconnections, i.e., write digit line WDL used in the data write operation and word line WL used in the data read operation are required for each memory cell row. This disadvantageously increases an area of circuitry related to the row selecting operation.

As already described, it is also necessary to pass the data write current through both write bit line WBL and write digit line WDL for the selected memory cell, into which data is to be written. Therefore, the data write current is supplied through either of write bit line WBL or write digit line WDL for the unselected memory cells in the same memory cell row or the same memory cell column including the selected memory cell.

On the unselected memory cells, data writing is not effected in theory. However, there is a possibility that minute write operations are effected due to an influence by noises and others, and therefore causes change in the magnetization direction of the free-magnetic layer. When effects by such phenomena are accumulated, erroneous writing of data may occur, and the stored data may disappear. Accordingly, it has been demanded to provide a structure, which can suppress the possibility of such erroneous data writing into the data write operation.

Further, operation tests must be performed to evaluate sufficiently a resistance to the erroneous data writing into each MTJ memory cell. Therefore, it is also required to provide a structure, which can efficiently conduct such operation tests on the whole memory cell array.

SUMMARY OF THE INVENTION

An object of the invention is to provide a thin-film magnetic memory device, in which an area of circuitry related to row selecting operations is reduced.

Another object of the invention is to provide a structure of a thin-film magnetic memory device, which can suppress occurrence of erroneous data writing into unselected memory cells in a data write operation.

Still another object of the invention is to provide a structure of a thin-film magnetic memory device, which allows efficient evaluation of a resistance to erroneous data writing in each MTJ memory cell.

According to the invention, a thin-film magnetic memory device includes a memory array including a plurality of memory cells arranged in rows and columns. Each of the memory cells has an electric resistance varying in accordance with storage data magnetically written by first and second data write currents. The thin-film magnetic memory device further includes a plurality of write digit lines provided corresponding to memory cell rows, respectively, and each being activated to pass the first data write current in the row direction; a plurality of write bit lines provided corresponding to memory cell columns, respectively, and each being activated to pass the second data write current in the column direction; a plurality of word lines provided corresponding to the memory cell rows for activating a selected row including the memory cell selected as a data read target, respectively; and a row selecting portion for executing the row selection in the memory array. The row selecting portion includes a row decode circuit for decoding a row address, a plurality of word line select circuits provided corresponding to the word lines, respectively, each for activating corresponding one of the word lines based on results of decoding of the corresponding memory cell rows in a data read operation, and a plurality of write digit line select circuits provided corresponding to the write digit lines, respectively, each for activating corresponding one of the write digit lines based on the results of decoding of the corresponding memory cell rows in the data write operation.

In the thin-film magnetic memory device according to the invention, therefore, the row decode circuit for decoding the row select results can be commonly used by the write digit line for data writing and the word line for data reading. As a result, an area of circuitry related to the row selection can be reduced, and an area of the MRAM device can be reduced.

According to another aspect of the invention, a thin-film magnetic memory device includes a memory array including a plurality of memory cells arranged in rows and columns, and divided into a plurality of blocks in a row direction. Each of the memory cells has an electric resistance varying in accordance with storage data magnetically written by first and second data write currents. The thin-film magnetic memory device further includes a plurality of write digit lines provided corresponding to memory cell rows, respectively, and each being activated to pass the first data write current through the selected row including the memory cell selected as a data write target; a plurality of main write bit lines each arranged for the memory cell rows of L (L: natural number more than one) in number, and each being activated to pass the second data write current therethrough; and a plurality of sub-write bit lines provided corresponding to the memory cell columns, respectively, in each of the blocks. Each of the sub-write bit lines is located in a position between the corresponding memory cell and the corresponding main write bit line. The thin-film magnetic memory device further includes a plurality of connection control portions provided corresponding the main write bit lines, respectively, in each of the blocks, respectively, and each configured to control connection between corresponding one of the main write bit line and the corresponding sub-write bit lines of L in number. Each of the connection control portion operates in the block including the selected memory cell to connect the selected one of the corresponding L sub-write bit line, corresponding to the selected memory cell, to the corresponding main write bit line, and to disconnect electrically each of the others of the corresponding L sub-write bit lines from the corresponding main bit line.

According to the thin-film magnetic memory device described above, the sub-write bit lines are divided, and activation of each of the sub-write bit lines can be controlled independently of the others so that the data write current in the column direction can be supplied only through a required region including the memory cell selected as the data write target. Accordingly, it is possible to reduce a possibility of erroneous writing of data into the unselected memory cell.

According to still another aspect of the invention, a thin-film magnetic memory device includes a memory cell array including a plurality of memory cells arranged in rows and columns. Each of the memory cells has an electric resistance varying in accordance with storage data magnetically written by first and second data write currents. The thin-film magnetic memory device further includes a plurality of write digit lines provided corresponding to memory cell rows, respectively, and each being activated to pass the first data write current in a row direction; a plurality of write bit lines provided corresponding to memory cell columns, respectively, and each being activated to pass the second data write current in a column direction; a plurality of word lines provided corresponding to the memory cell rows, respectively, and each being activated to pass a data read current through selected at least one of the memory cells; and a multi-selection control portion for activating at least two of the write digit lines, at least two of the write bit lines, and/or at least two of the word lines, in parallel in an operation test.

In the operation test, therefore, the plurality of write digit lines, the plurality of write bit lines, and/or the plurality of word lines can be activated in parallel so that the operation test can be conduced efficiently in a short time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in greater detail with reference to the drawings. In the figures, the same or corresponding portions bear the same reference numbers.

First Embodiment

Figure 1:
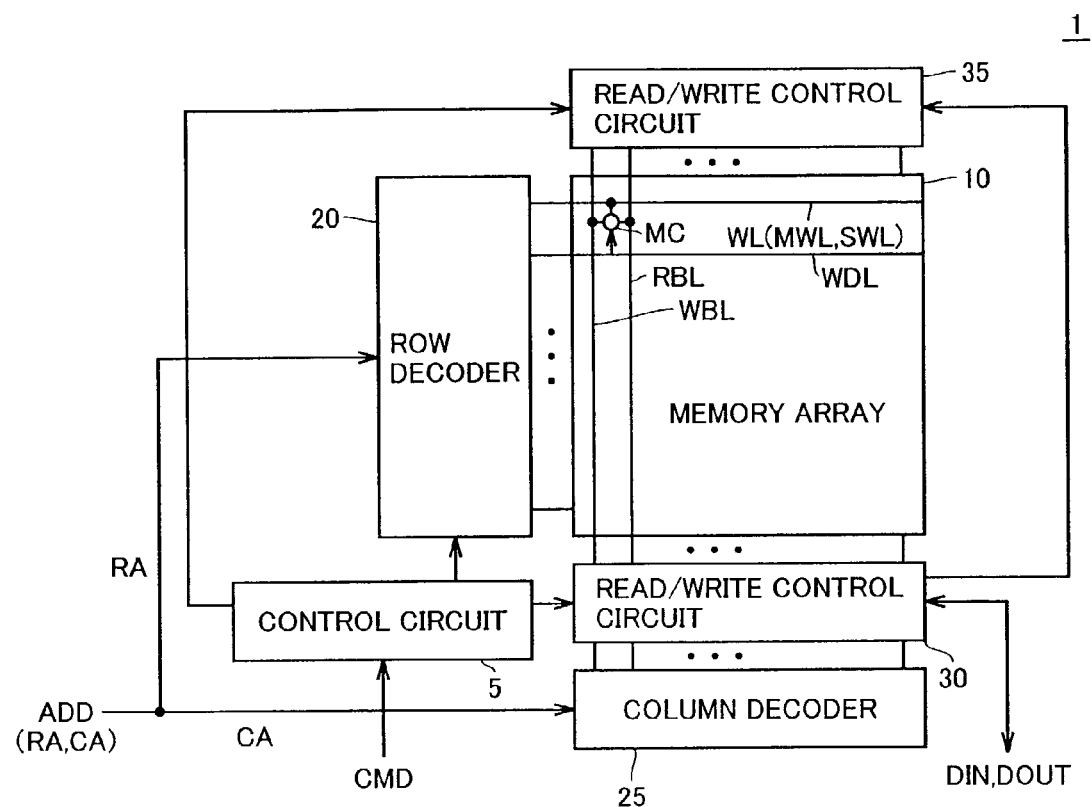
FIG. 1 is a schematic block diagram showing a whole structure of an MRAM device according to a first embodiment of the invention.

Referring to FIG. 1, an MRAM device 1 according to a first embodiment of the invention performs random access in response to externally applied control signal CMD and address signal ADD, and executes input of write data DIN and output of read data DOUT.

MRAM device 1 includes a control circuit 5 for controlling a whole operation of MRAM device 1 in response to a control signal CMD, and a memory array 10 having a plurality of MTJ memory cells arranged in rows and columns.

Figure 21:
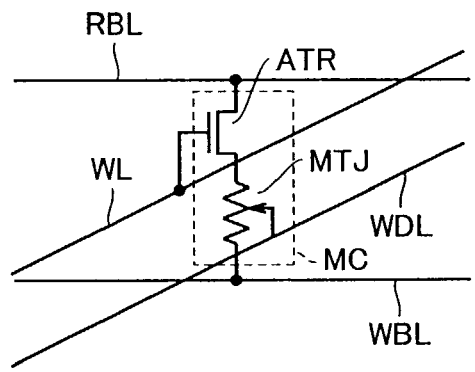
FIG. 21 schematically shows a structure of an MTJ memory cell.

Memory array 10 includes a plurality of MTJ memory cells arranged in rows and columns. The MTJ memory cell has the same structure as that shown in FIG. 21. FIG. 1 representatively shows one MTJ memory cell as well as a word line WL, a write digit line WDL, a write bit line WBL and a read bit line RBL corresponding to the MTJ memory cell shown in FIG. 1. Word line WL and write digit line WDL are arranged corresponding to the memory cell row. In the structure of the first embodiment, each word line WL is divided hierarchically into a main word line MWL arranged for a plurality of memory cell rows and sub-word lines SWL each arranged for one memory cell row. Each read bit line RBL and each write bit line WBL are arranged corresponding to one memory cell column.

In the data write operation, write digit line WDL in the memory cell row, which corresponds to the selected memory cell, and will also be referred to as a "selected row" hereinafter, as well as write bit line WBL in the memory cell column, which corresponds to the selected memory cell, and will also be referred to as a "selected column" hereinafter, are activated to pass a data write current therethrough. In the data read operation, word line WL (sub-word line SWL) corresponding to the selected memory cell is activated to attain a high-voltage state, and a sense current (data read current) Is passes through the selected memory cell and read bit line RBL.

In memory array 10, the MTJ memory cells and groups of the foregoing signal lines are disposed as will be described later in greater detail. In the following description, "H-level" and "L-level" represent binary states, i.e., a high voltage state (power supply voltage Vcc) and a low voltage state (ground voltage Vss) of each of signals, signal lines, data and others, respectively.

MRAM device 1 further includes a row decoder 20 for decoding a row address RA represented by an address signal ADD to output results of decoding for selecting a row in memory array 10, a column decoder 25 for decoding a column address CA represented by address signal ADD to output results of decoding for selecting a column in memory cell 10, and read/write control circuits 30 and 35.

Read/write control circuits 30 and 35 collectively represent circuits such as a circuit for passing data write current through write bit line WBL in the data write operation, a circuit for passing a sense current through read bit line RBL in the data read operation and a circuit for producing read data by detecting a voltage on read bit line RBL.

Figure 2:
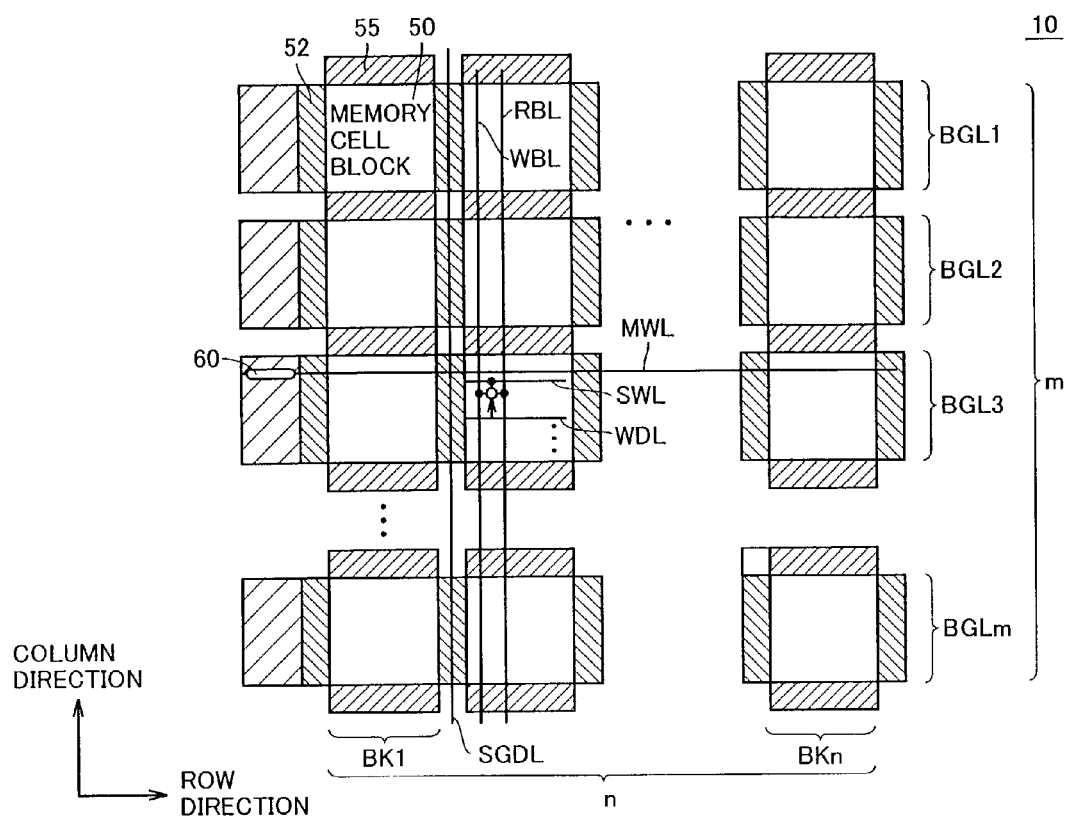
FIG. 2 shows a structure of a memory array shown in FIG. 1.

Referring to FIG. 2, memory array 10 is divided into memory cell blocks 50 each surrounded by sub-word driver bands 52 and sub-column driver bands 55. In whole memory array 10, memory cell blocks 50 are arranged in m rows and n columns (m, n: natural numbers). In the following description, the memory cell block including the selected memory cell will be merely referred to as a selected memory cell block.

The memory cell blocks of m in number, which neighbor to each other in the column direction, form the same bank. Thus, memory array 10 is divided into banks BK1–BKn of n in number. Similarly, the memory cell blocks of n in number neighboring to each other in the row direction form the same block group. Thus, memory array 10 is divided into block groups BGL1–BGLm of m in number.

In each memory cell block 50, the MTJ memory cells are arranged in rows and columns. Sub-word line SWL for data reading and write digit line WDL for data writing are arranged for each memory cell row. Thus, each write digit line WDL in each sub-block is disposed corresponding to one memory cell row, and is independent of those in the other sub-blocks. In the structure of the first embodiment, main word line MWL is hierarchically arranged as an upper signal line for row selection with respect to lower sub-word lines SWL and write digit lines WDL. Each main word line MWL is provided for a plurality of memory cell rows, and extends through the neighboring memory cell blocks of n in number.

A main word driver 60 is arranged for each main word line MWL. Each main word driver 60 activates corresponding main word line MWL in accordance with results of row selection by row decoder 20.

Write bit line WBL for data writing and read bit line RBL are arranged corresponding to each memory cell column. In the structure of the first embodiment, each of write bit line WBL and read bit line RBL is arranged in common to the m memory cell blocks neighboring to each other in the column direction. These bit lines may be hierarchically divided into upper and lower bit lines similarly to the word lines. For this hierarchical arrangement, a circuit group for controlling the connection between these bit lines is arranged in sub-column driver band 55.

A segment decode line SGDL is arranged in the column direction. Segment decode line SGDL is activated in response to the decoding results of row decoder 20 to transmit signals for controlling active ranges of sub-word line SWL and write digit line WDL. Segment decode line SGDL extends through the sub-word driver band, and includes bank select line BSL, select line SL and reset line RSL, as will be described later. Segment decode line SGDL in each bank is controlled independently of those in the other banks.

In sub-word driver band 52, a circuit group is arranged for controlling activation of sub-word lines SWL and write digit lines WDL in accordance with corresponding segment decode line SGDL and main word line MWL.

Figure 3:
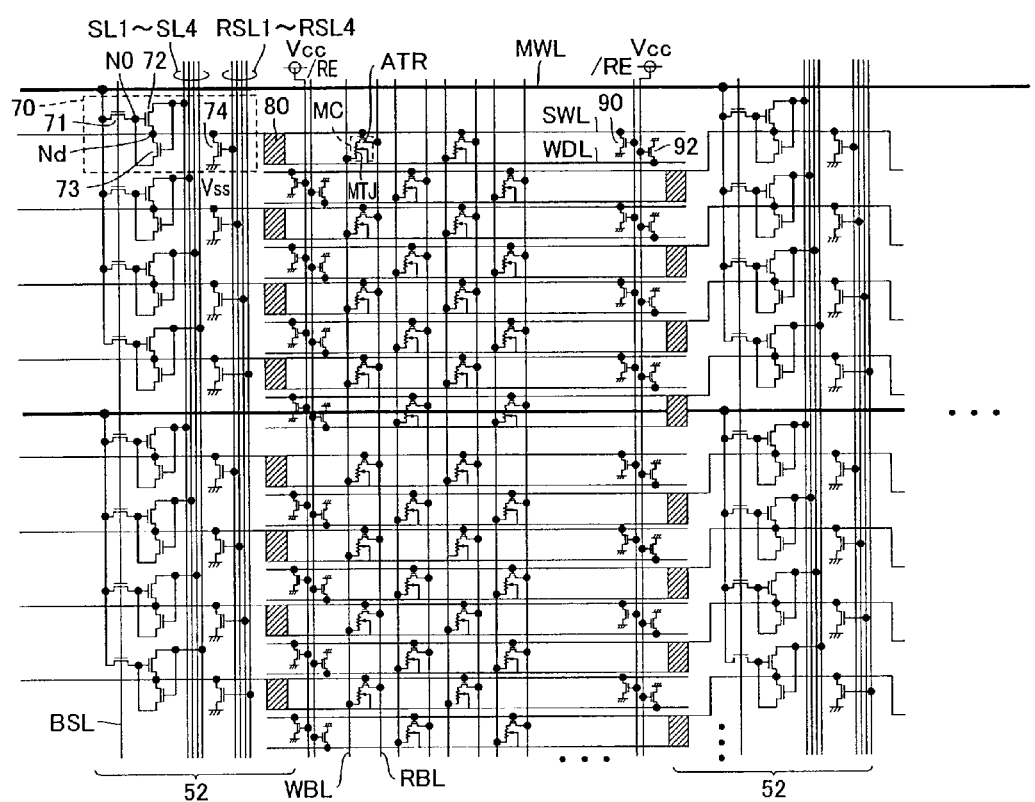
FIG. 3 is a circuit diagram showing specific structures of a sub-word driver band and a sub-block.

Referring to FIG. 3, a sub-word driver 70 and a sub-row decoder 80 corresponding to each memory cell row are arranged in sub-word driver 52.

In FIG. 3, it is assumed that one main word line MWL is arranged for four memory cell rows. In each memory cell block, therefore, one main word line MWL is related to four sub-word lines SWL and four write digit lines WDL. From four sub-word lines SWL (in the data read operation) and four write digit lines WDL (in the data write operation) corresponding to one main word line MWL, one sub-word line SWL or one write digit line WDL is selected in accordance with the designation by activation (H-level) of one of select lines SL. Reset lines RSL1–RSL4 are arranged for resetting the decoding results temporarily held in the sub-word drivers. Select lines SL1–SL4 may be collectively referred to as "select lines SL", and reset lines RSL1–RSL4 may be collectively referred to as "reset lines RSL". Bank select line BSL is activated to attain H-level when the corresponding bank includes the selected memory cell block.

Sub-word driver 70 includes a select transistor 71, which has a gate voltage controlled by bank select line BSL, and is arranged between main word line MWL and an internal node N0, a transistor 72, which has a gate voltage controlled by internal node N0, and is connected between one (e.g., select line SL0) of select lines SL and a node Nd for holding the decoding results, and a transistor 73, which has a gate voltage controlled by the same select line (SL0) as transistor 72, and is connected between internal node N0 and node Nd. Sub-word driver 70 further includes a transistor 74, which has a gate voltage controlled by reset line RSL, and is arranged between node Nd and ground voltage Vss.

Bank select line BSL is set to H-level (power supply voltage Vcc) when it is active. After node Nd holds the decoding results, the level of bank select line BSL changes to L-level (ground voltage Vss). In this operation, a latch circuit formed of transistors 72 and 73 holds the active state of bank select line BSL. The voltage levels of select line SL and reset line RSL are controlled to be complementary to each other.

During standby, the bank select line BSL is at L-level (ground voltage Vss), select line SL is at L-level (ground voltage Vss) and reset line RSL is at H-level (power supply voltage Vcc). In the active state (i.e., operating state), corresponding reset line RSL is first inactivated to attain L-level (ground voltage Vss), and bank select line BSL corresponding to the selected row is activated to attain H-level (power supply voltage Vcc).

Then, main word line MWL corresponding to the selected row is activated to attain H-level (power supply voltage Vcc). Substantially simultaneously with this activation of main word line MWL, one of select lines SL corresponding to the selected row is set to H-level (power supply voltage Vcc). In accordance with this, node Nd corresponding to the selected row attains H-level, i.e., (Vcc–Vth) level, where Vth represents a sum of threshold voltages of transistors 71 and 73.

Thereafter, bank select line BSL is inactivated to attain L-level (ground voltage Vss), and the latch circuit formed of transistors 72 and 73 in sub-word driver 70 confines electric charges within node Nd. In this state, the voltage on the selected one of select lines SL may be raised to H-level (power supply voltage Vcc), whereby the voltage on node Nd corresponding to the selected row is raised to the level of power supply voltage Vcc and is latched in the selected memory cell block.

In the reset operation, bank select line BSL is set to H-level (power supply voltage Vcc), and select line SL is set to L-level (ground voltage Vss). Further, reset line RSL is set to H-level (power supply voltage Vcc) so that the charges stored in node Nd are discharged. Owing to the above structure, sub-word driver 70 can be formed of only four elements, i.e., N-channel MOS transistors, and therefore the required elements can be reduced in number.

Activation of main word line MWL is performed by a one-shot pulse signal. Thus, in the selected row within the selected memory cell block, the voltage on main word line MWL can be reset to L-level after transistors 72 and 73 in sub-word driver 70 once hold the active state (H-level) of the main word line.

According to the above structure, the voltage level on main word line MWL does not affect each sub-word driver 70 even if a plurality of banks commonly use the same main word line as shown in FIG. 2, unless bank select line BSL is activated. Accordingly, the plurality of memory cell blocks neighboring to each other in the row direction can operate as independent banks, respectively.

Other sub-word drivers employ the same structure as the above. Owing to the above structure, node Nd corresponding to the selected row in the selected memory cell block is set to and held at the active state (H-level of power supply voltage Vcc) by activating main word line MWL, activating bank select line BSL and selectively activating select lines SL. Thus, the decoding results (results of row selection) can be held in sub-word driver 70.

When reset lines RSL are selectively activated to discharge it to the ground voltage, the decoding results (row selection results) temporarily held in the sub-word driver are reset.

Sub-row decoders 80 corresponding to alternate memory cell rows are arranged on the same side so that all sub-row decoders 80 are staggered. Thus, sub-row decoders 80 use two sub-word driver bands 52 neighboring to one memory cell block, and are arranged such that alternate sub-row decoders 80 are arranged in the sub-word driver band corresponding to ends on one side of sub-word line SWL and write digit line WDL, and alternate sub-row decoders 80 other than the above are arranged in the sub-word driver band corresponding to the other ends of sub-word line SWL and write digit line WDL. Thereby, sub-row decoders 80 can be arranged efficiently in a short area.

Sub-row decoder 80 controls activation of sub-word line SWL and write digit line WDL based on the decoding results of the corresponding memory cell row held in sub-word driver 70. Sub-word line SWL and write digit line WDL are arranged to correspond to MTJ memory cells MC belonging to the same memory cell row in each memory cell block. Write bit line WBL and read bit lines RBL are arranged to correspond to MTJ memory cells MC in the same memory cell column.

For each memory cell row, a transistor switch 90 is arranged for fixing sub-word line SWL to ground voltage Vss during the operations including data writing and others except for data reading, and a transistor switch 92 is also arranged for connecting one end of write digit line WDL to ground voltage Vss.

Transistor switch 90 receives on its gate an inverted signal /RE of a control signal RE, which is active and at H-level in the data read operation, and is arranged between sub-word line SWL and ground voltage Vss. Transistor 90 has a gate coupled to power supply voltage Vcc, and is arranged between write digit line WDL and ground voltage Vss.

The other end of write digit line WDL is selectively set to H-level (power supply voltage Vcc) by sub-row decoder 80 in accordance with the row selection results. Thereby, data write current Ip can be supplied to active write digit line WDL in the direction from sub-row decoder 80 toward transistor switch 92.

Figure 4:
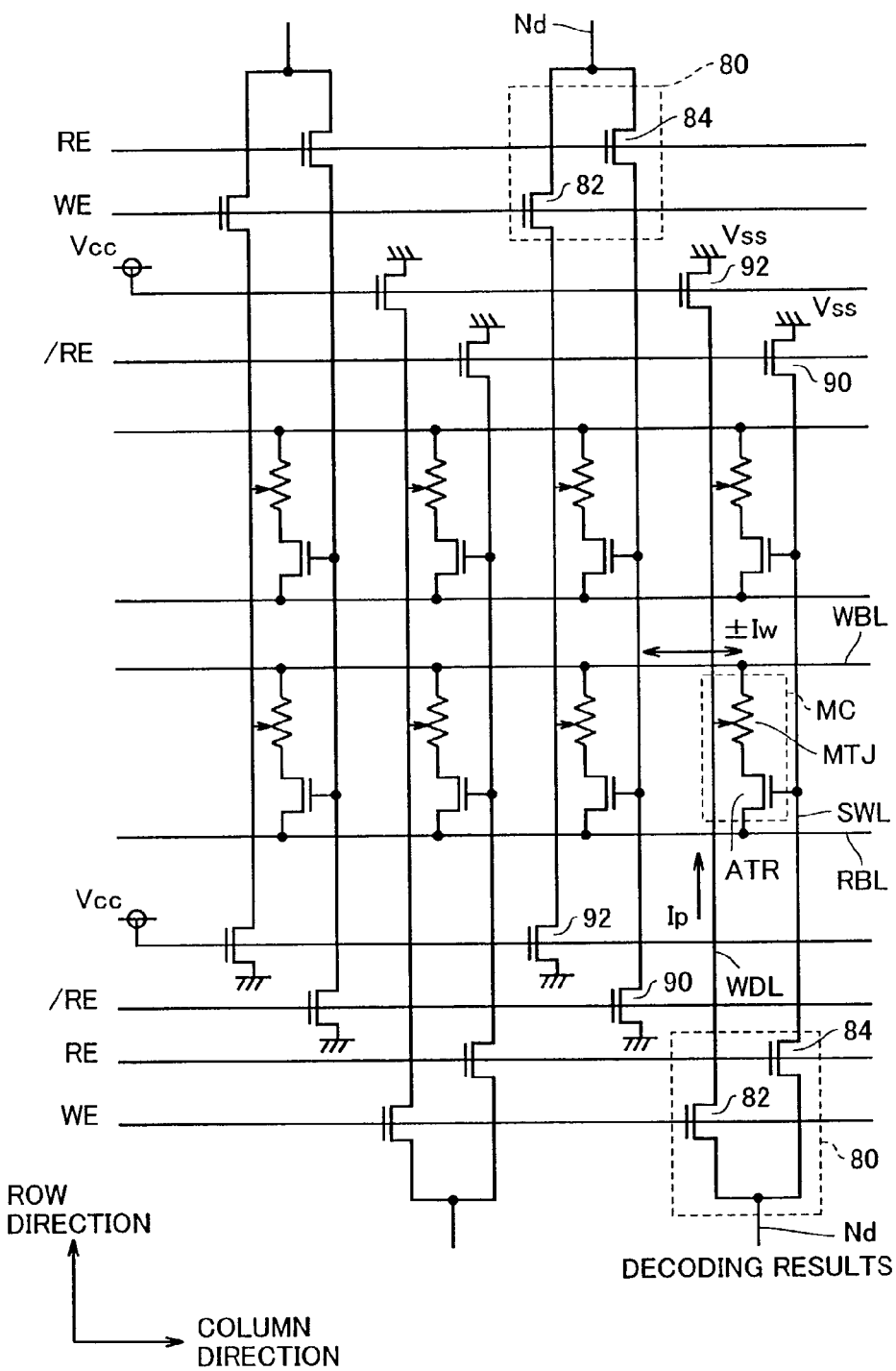
FIG. 4 is a circuit diagram showing a specific structure of a sub-row decoder shown in FIG. 3.

FIG. 4 is a circuit diagram specifically showing a structure of sub-row decoder 80.

FIG. 4 representatively shows four memory cell rows corresponding to one main word line MWL. Sub-row decoder 80 corresponding to each memory cell row has the same structure as the others, and therefore description will now be given on only the structure corresponding to one memory cell row.

Referring to FIG. 4, sub-row decoder 80 has a transistor switch 82 arranged between node Nd holding the decoding results (row selection results) and write digit line WDL, and a transistor switch 84 arranged between node Nd and sub-word line SWL. Transistor switch 82 receives on its gate a control signal WE, which is activated to attain H-level in the data write operation. Transistor switch 84 receives on its gate control signal RE, which is activated to attain H-level in the data read operation.

In each sub-row decoder 80, transistor switch 82 is turned on, and transistor switch 84 is turned off in the data write operation. In the data read operation, transistor switch 84 is turned on, and transistor switch 82 is turned off.

In each of the data read operation and data write operation, node Nd holds the decoding results of the corresponding memory cell row. Node Nd corresponding to the selected row in the selected memory cell block is set to H-level (power supply voltage Vcc), and otherwise is set to L-level (ground voltage Vss).

In the data write operation, transistor switch 82 is turned on in response to control signal WE, and activates the corresponding write digit line WDL based on the decoding results of the corresponding memory cell row. Since activated write digit line WDL is connected to node Nd set to H-level (power supply voltage Vcc), data write current Ip flows from sub-row decoder 80 toward transistor switch 92 in the on state.

Accordingly, write digit line WDL for passing data write current Ip in the row direction is divided corresponding to the memory cell blocks so that data write current Ip can be supplied only to write digit line WDL corresponding to the selected memory cell block.

The write bit line drivers (not shown) provided in read/write control circuits 30 and 35 shown in FIG. 1 set opposite ends of write bit line WBL corresponding to the selected column to H-level (power supply voltage Vcc) and L-level (ground voltage Vss), or L-level and H-level, respectively. The voltage setting on the opposite ends of write bit line WBL is switched in accordance with the level of the write data. Therefore, the data write current flowing in the column direction through write bit line WBL has a direction (+Iw or −Iw) depending on the level of the storage data. In the following description, the data write currents in both the directions are referred to as "data write current ±Iw" hereinafter.

Owing to the above structure, data write current Ip flows only through a required minimum region including the selected memory cell forming the data write target. Thus, data write current Ip in the row direction does not flow in the banks other than the selected bank including the selected memory cell. Therefore, the possibility of erroneous data writing into the unselected memory cell can be suppressed more effectively than a structure, in which write digit line WDL is not arranged hierarchically, and thus is commonly used by the memory cell blocks neighboring to each other in the row direction.

In the data read operation, transistor switch 90 disconnects each sub-word line SWL from ground voltage Vss. Further, transistor switch 84 is turned on in response to control signal RE, and activates corresponding sub-word line SWL based on the voltage on node Nd, i.e., the decoding results of the memory cell row. Activated sub-word line SWL is connected to node Nd set to H-level (power supply voltage Vcc). In response to this, each of access transistors ATR corresponding to the selected row is turned on to couple electrically magnetic tunnel junction MTJ between write bit line WBL and read bit line RBL.

In the selected column, sense current Is supplied and passed through magnetic tunnel junction MTJ and read bit line RBL of the selected memory cell so that the voltage on read bit line RBL can be detected, and the storage data of the selected memory cell can be read out.

By the provision of sub-row decoders 80 described above, write digit line WDL and sub-word line SWL can commonly use the decoders. More specifically, sub-word line SWL for data reading and write digit line WDL for data writing can commonly use row decoder 20 and sub-word driver 70. Therefore, a circuit area related to the row selection can be reduced, and the area of the MRAM device can be reduced.

Second Embodiment

A second embodiment relates to a structure, in which write bit lines WBL for passing data write current ±Iw in the column direction are arranged hierarchically.

Figure 5:
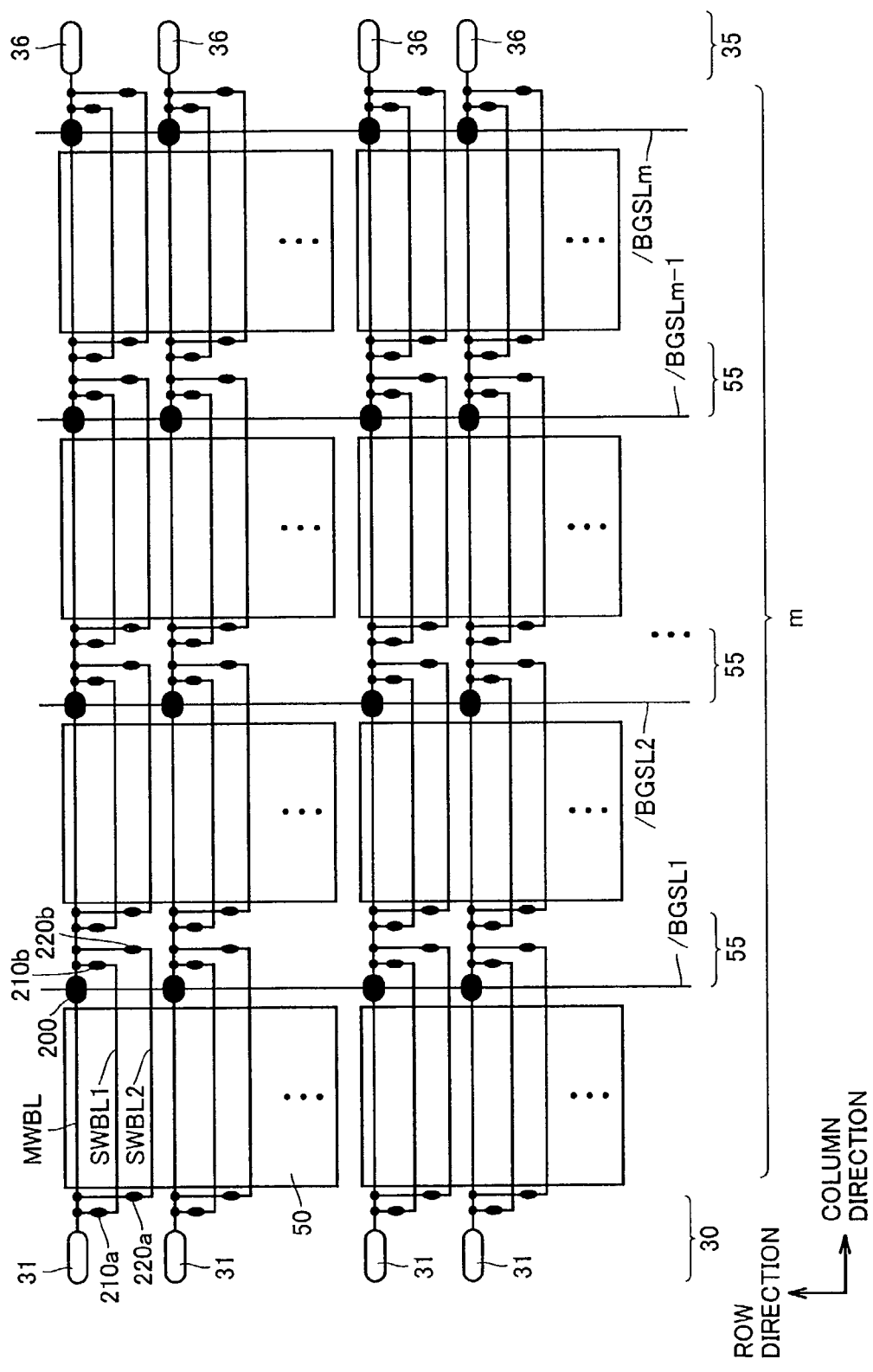
FIG. 5 is a schematic block diagram showing a hierarchical arrangement of main write bit lines and sub-write bit lines.

Referring to FIG. 5, a hierarchical bit line arrangement according to the second embodiment includes sub-write bit lines SWBL, which are arranged in each memory cell block 50, and correspond to the memory cell columns, respectively. Main write bit line MWBL is common to the m memory cell blocks belonging to the same bank, and is arranged for the plurality of memory cell columns.

In the second embodiment, each main write bit line MWBL is arranged, e.g., for two memory cell columns. In each memory cell block, therefore, two sub-write bit lines SWBL1 and SWBL2 correspond to one main write bit line MWBL. Sub-write bit lines SWBL1 and SWBL2 may be merely referred to as "sub-write bit lines SWBL".

Figure 6:
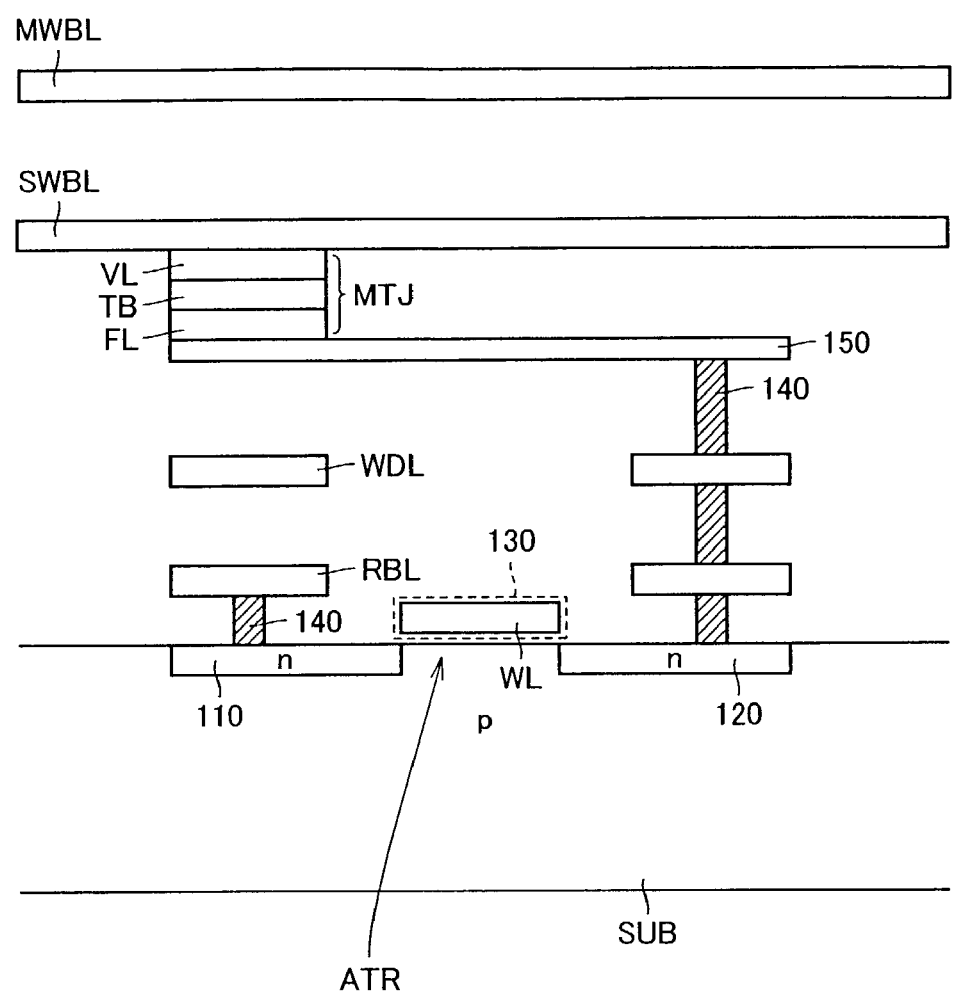
FIG. 6 shows a structure of an MTJ memory cell having write bit lines arranged in a hierarchical fashion.
Figure 22:
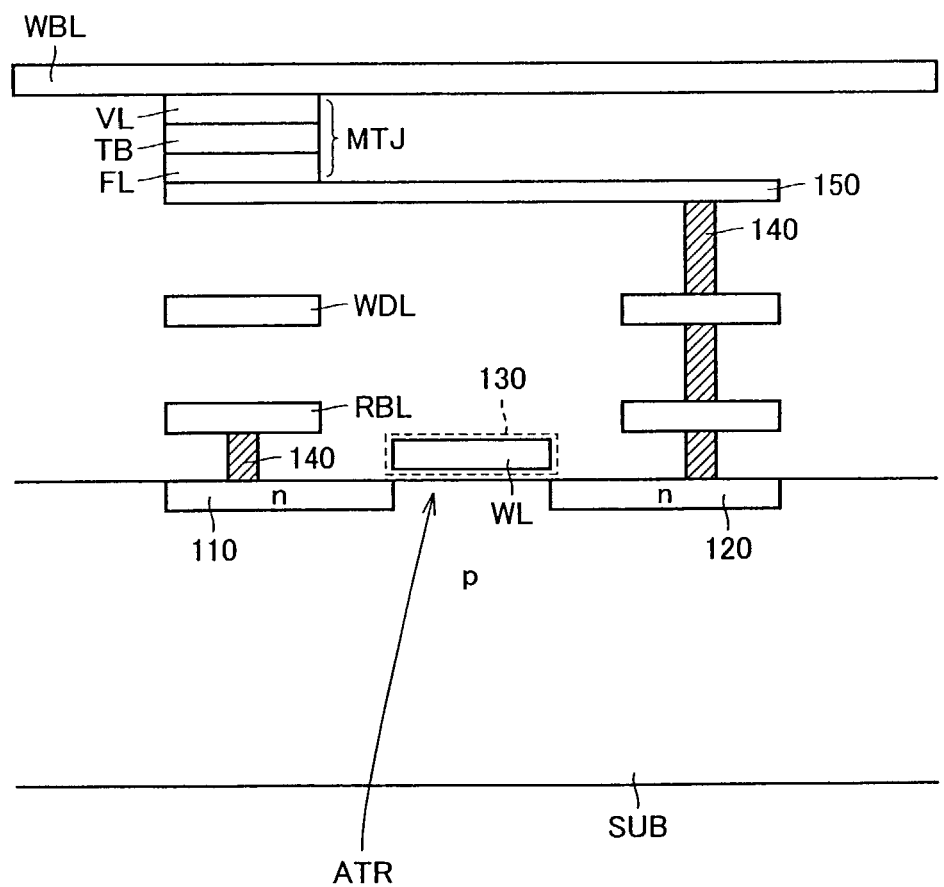
FIG. 22 shows a structure of the MTJ memory cell formed on a semiconductor substrate.
Figure 23:
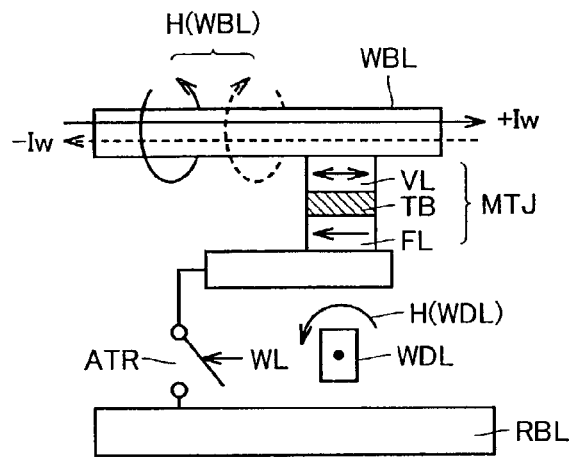
FIG. 23 conceptually shows a data write operation for the MTJ memory cell.

Referring to FIG. 6, the MTJ memory cell connected to the hierarchically arranged write bit line is arranged such that sub-write bit line SWBL for passing data write current ±Iw in the column direction corresponds to write bit line WBL shown in FIG. 22, and neighbors to magnetic tunnel junction MTJ. Main write bit line MWBL is arranged at a higher level than sub-write bit line SWBL. Therefore, sub-write bit line SWBL is located in a position between magnetic tunnel junction MTJ (MTJ memory cell) and main write bit line MWBL.

In the selected memory cell block, the data write current in the column direction flows through sub-write bit line SWBL. In the unselected sub-block, data write current ±Iw flows through main write bit line MWBL.

In the unselected memory cell block, therefore, data write current ±Iw can reduce the intensity of the magnetic field acting on magnetic tunnel junction MTJ. The structures of the MTJ memory cell and other portions are the same as those shown in FIG. 22, and therefore description thereof is not repeated.

Referring to FIG. 5, read/write control circuits 30 and 35 include write bit line drivers 31 and 36 arranged on the opposite ends of each of main write bit line MWBL, respectively. Write bit line driver 31 connects one end of main write bit line MWBL to one of power supply voltage Vcc and ground voltage Vss in accordance with the data level of write data DIN when corresponding main write bit line MWBL is selected in accordance with the column selection results. Write bit line driver 36 connects the other end of corresponding main write bit line MWBL to the other of power supply voltage Vcc and ground voltage Vss in a manner complementary to write bit line driver 31 when corresponding main write bit line MWBL is selected.

Thus, the opposite ends of selected main write bit line MWBL are connected complementarily to power supply voltage Vcc and ground voltage Vss, or vice versa in accordance with the data level of write data DIN, respectively. Thereby, data write current ±Iw can be supplied to selected main write bit line MWBL in accordance with the direction corresponding to the data level of write data DIN.

In each memory cell block, select transistor switches 200, 210a, 210b, 220a and 220b are arranged for controlling connection between each main write bit line MWBL and two sub-write bit lines SWBL1 and SWBL2.

The select transistor switch connects sub-write bit line SWBL corresponding to the selected column in the selected memory cell block to main write bit line MWBL. Other sub-write bit lines SWBL are electrically isolated from main write bit line MWBL.

Block group select signals /BGSL1–/BGSLm are employed corresponding to the m block groups, respectively. Each of block group select signals /BGSL1–/BGSLm is commonly used by the plurality of sub-blocks belonging to the same block group. One of block group select signals /BGSL1–/BGSLm corresponding to the selected memory cell block is activated to attain L-level, and the others not corresponding to the selected memory cell block are inactivated to attain H-level. Block group select signals /BGSL1–/BGSLm may be collectively referred to as "block group select signals /BGSL".

Figure 7:
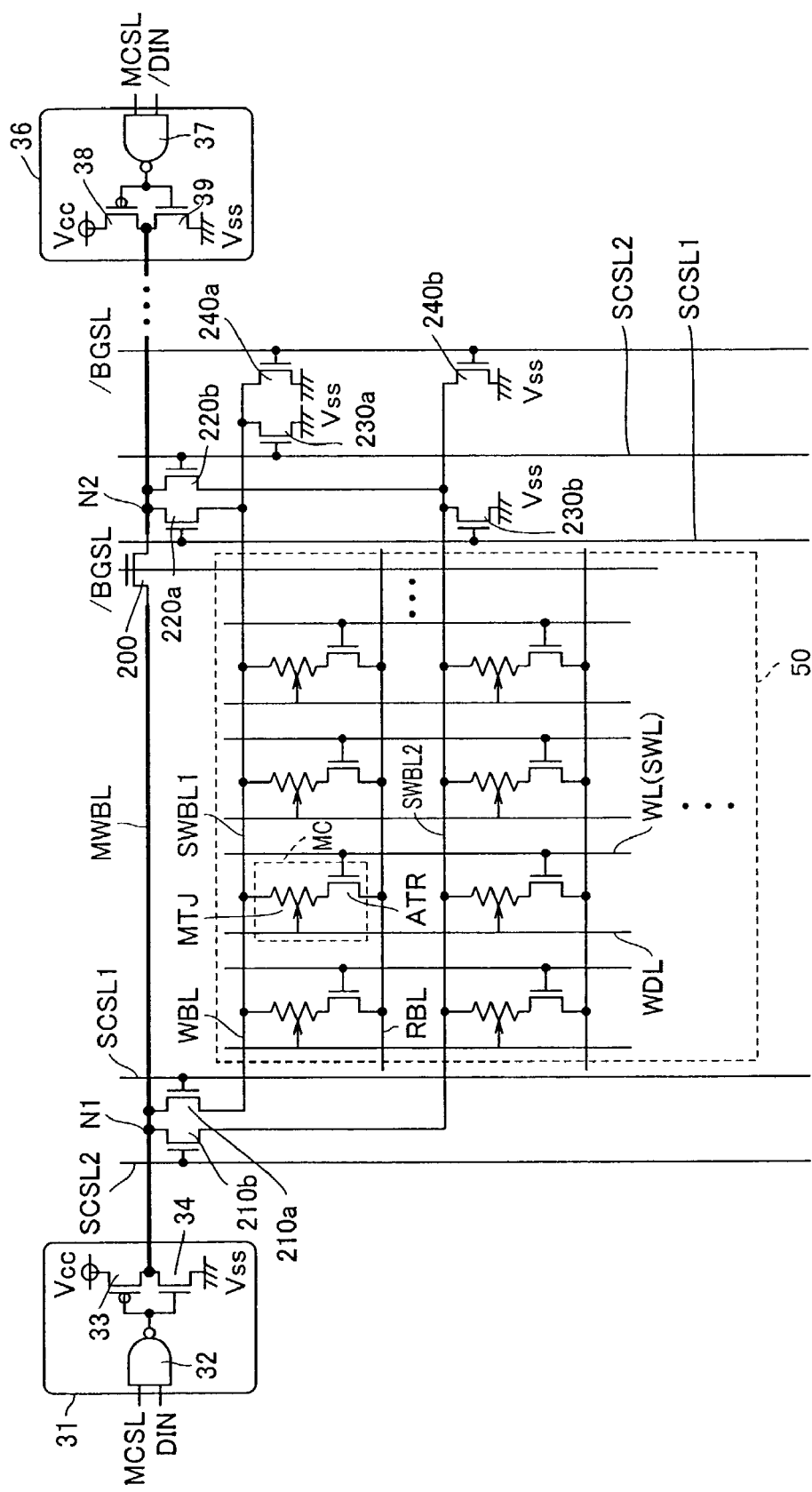
FIG. 7 is a circuit diagram specifically showing an arrangement of select switches according to a second embodiment.

FIG. 7 is a circuit diagram specifically showing an arrangement of the select switches according to the second embodiment.

In each memory cell block, the select transistor switches are arranged for each main write bit line MWBL in the same fashion as those for other main write bit lines MWBL, and therefore, FIG. 7 representatively shows a structure for one main write bit line MWBL in one memory cell block.

Referring to FIG. 7, write bit line driver 31 has a logic gate 32 as well as driver transistors 33 and 34 forming a CMOS inverter. Logic gate 32 outputs results of logical NAND between a main column select signal MCSL, which is a select signal for main write bit line MWBL, and write data DIN. Driver transistor 33 is a P-channel MOS transistor, and is arranged between one end of main write bit line MWBL and power supply voltage Vcc. Driver transistor 34 is an N-channel MOS transistor, and is arranged between one end of main write bit line MWBL and ground voltage Vss. The output of logic gate 32 controls a gate voltage of each of driver transistors 33 and 34.

Write bit line driver 36 has a logic gate 37 as well as driver transistors 38 and 39 forming a CMOS inverter. Logic gate 37 outputs results of logical NAND between main column select signal MCSL, which is a select signal for main bit line MWBL, and inverted signal /DIN of write data DIN. Driver transistor 38 is a P-channel MOS transistor, and is arranged between the other end of main write bit line MWBL and power supply voltage Vcc. Driver transistor 39 is an N-channel MOS transistor, and is arranged between the other end of main write bit line MWBL and ground voltage Vss. The output of logic gate 37 controls a gate voltage of each of driver transistors 38 and 39.

In write bit line drivers 31 and 36 for unselected main write bit lines MWBL, the outputs of logic gates 32 and 37 are set to H-level. Therefore, the opposite ends of each unselected main write bit line MWBL are connected to ground voltage Vss.

The opposite ends of the selected main write bit line MWBL are connected by write bit lines drivers 31 and 36 to power supply voltage Vcc and ground voltage Vss, or vice versa in accordance with the data level of write data DIN, respectively. When write data DIN is at H-level ("1"), write bit line driver 31 connects one end of main write bit line MWBL to power supply voltage Vcc, and write bit line driver 36 connects the other end of main write bit line MWBL to ground voltage Vss.

When write data DIN is at L-level ("0"), write bit line driver 31 connects one end of main write bit line MWBL to ground voltage Vss, and write bit line driver 36 connects the other end of main write bit line MWBL to power supply voltage Vcc.

A select transistor switch 200 is arranged in each memory cell block, and is inserted in series with respect to main write bit line MWBL. Select transistor switch 200 is arranged between nodes N1 and N2 for interrupting a current path on main write bit line MWBL in the selected memory cell block. Select transistor switch 200 receives block group select signal /BGSL on its gate.

Select transistor switch 210*a* is arranged between one end of sub-write bit line SWBL and node N1 on main write bit line MWBL. Select transistor switch 220*a* is arranged between the other end of sub-write bit line SWBL1 and node N2 on main write bit line MWBL. Select transistor switches 210*a* and 220*a* receive sub-column select signal SCSL1 on their gates. Sub-column select signals SCSL1 and SCSL2 are signals for selecting one of the two sub-write bit lines corresponding to one main write bit line MWBL.

Select transistor switch 210*b* is arranged between one end of sub-write bit line SWBL2 and node N1. Select transistor switch 220*b* is arranged between the other end of sub-write bit line SWBL2 and node N2. Each of select transistor switches 210*b* and 220*b* receives sub-column select signal SCSL2 on its gate.

Further, select transistor switches 230*a* and 240*a* are arranged for coupling sub-write bit line SWBL1 to ground voltage Vss. Also, select transistor switches 230*b* and 240*b* are electrically coupled between sub-write bit line SWBL2 and ground voltage Vss. Select transistor switch 230*a* receives sub-column select signal SCSL2 on its gate, and select transistor switch 230*b* receives sub-column select signal SCSL1 on its gate. Each of select transistor switches 240*a* and 240*b* receives block group select signal /BGSL on its gate. These select transistor switches depicted in FIG. 7 are typically formed of N-channel MOS transistors.

Figure 8:
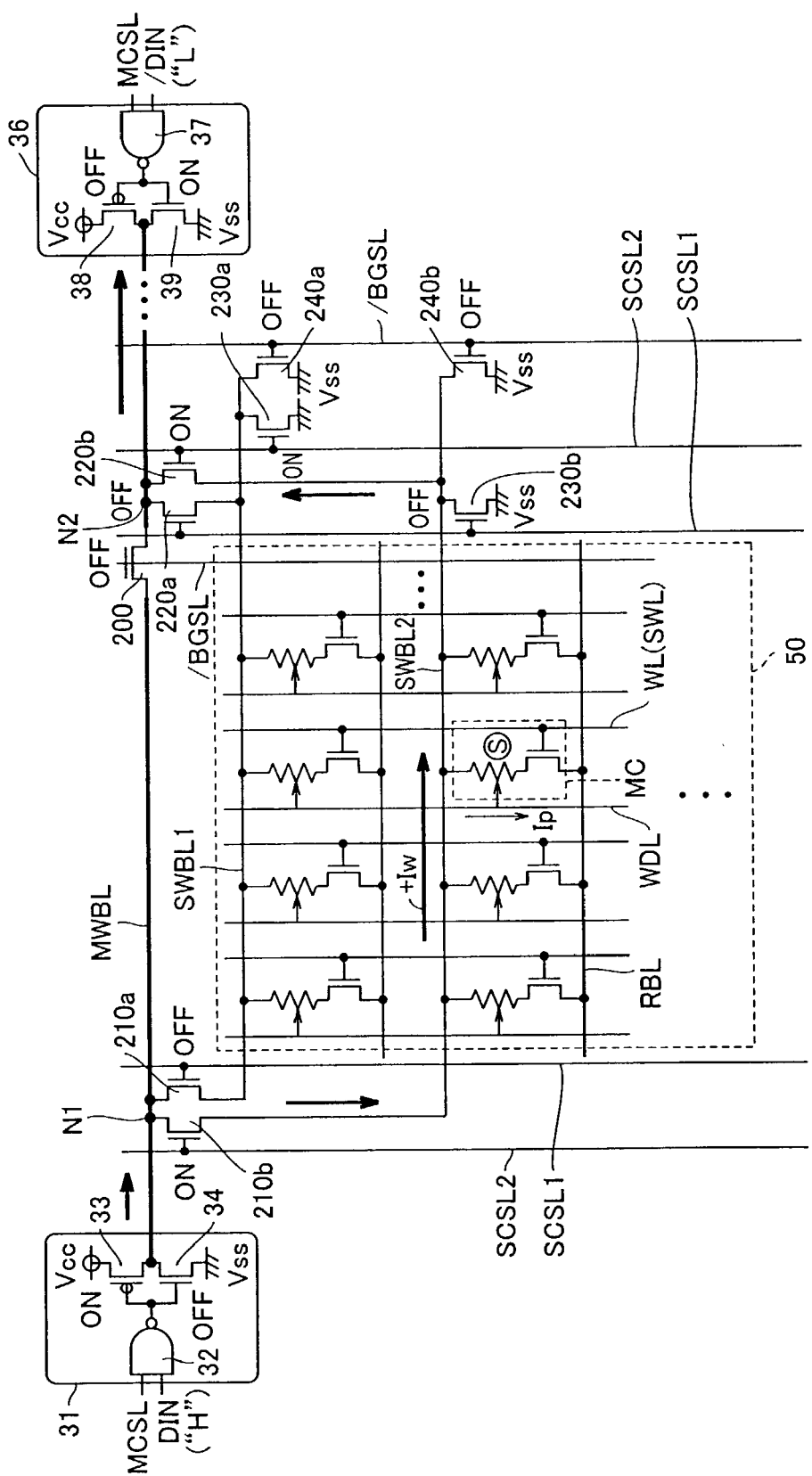
FIGS. 8 and 9 are circuit diagrams showing a path of a data write current in a column direction within a selected memory cell block according to the second embodiment.

FIG. 8 shows a current path of the data write current in the case where data at H-level ("1") is to be written into the selected memory cell indicated by "S" in the figure.

For generating data write current +Iw used for writing write data DIN at H-level, write bit line driver 31 in FIG. 8 connects one end of corresponding main write bit line MWBL to power supply voltage Vcc, and write bit line driver 36 connects the other end of main write bit line MWBL to ground voltage Vss.

In the selected memory cell block, corresponding block group select signal /BGSL is activated to attain L-level. Thereby, each of select transistor switches 200, 240*a* and 240*b* is turned off. In the unselected memory cell blocks, select transistor switches 200 are turned on.

In the unselected memory cell block within the same bank, data write current +Iw in the column direction passes through main write bit line MWBL. In the selected memory cell block, select transistor switch 200 interrupts the current path on main write bit line MWBL for passing data write current +Iw through sub-write bit line SWBL.

In the selected memory cell block, sub-column select signal SCSL1 is inactivated to attain L-level, and sub-column select signal SCSL2 is activated to attain H-level for passing the data write current through sub-write bit line SWBL2.

Therefore, each of select transistors 210*b*, 220*b* and 230*a* is turned on, and each of select transistor switches 210*a*, 220*a* and 230*b* is turned off. Thereby, data write current +Iw, of which current path on main write bit line MWBL is interrupted by select transistor switch 200, flows through select transistor switches 210*b* and 220*b* to sub-write bit line SWBL2. Further, data write current Ip flows in the row direction through write digit line WDL corresponding to the selected memory cell based on the results of row selection. Thereby, data at H-level can be written into the selected memory cell.

Figure 9:
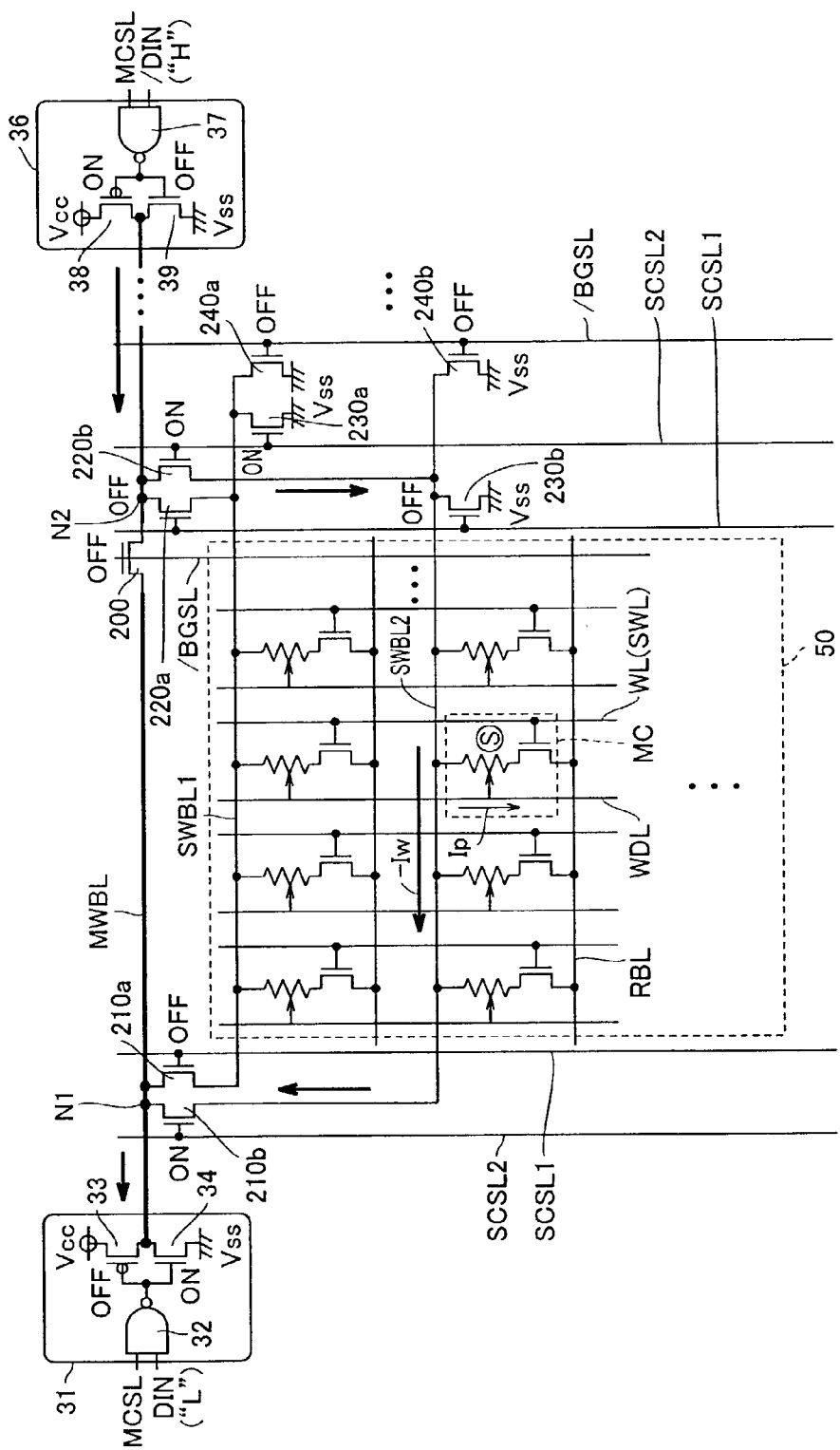

FIG. 9 shows a current path of the data write current in the case where data at L-level ("0") is to be written into the selected memory cell indicated by "S" in the figure.

For generating data write current −Iw used for writing write data DIN at L-level, the voltages on opposite ends of main write bit line MWBL are set to the levels opposite to those shown in FIG. 8. More specifically, write bit line driver 31 connects one end of main write bit line MWBL to ground voltage Vss, and write bit line driver 36 connects the other end of main write bit line MWBL to power supply voltage Vcc.

Block group select signals /BGSL and sub-column select signals SCSL1 and SCSL2 are set similarly to those in FIG. 8. Therefore, select transistor switches 200, 240*a* and 240*b* are turned off, select transistor switches 210b, 220b and 230a are turned on, and select transistors 210a, 220a and 230b are turned off, similarly to those in FIG. 8.

Thereby, data write current −Iw, of which current path on main write bit line MWBL is interrupted by select transistor switch 200, flows through select transistor switches 210b and 220b to sub-write bit line SWBL2. Further, data write current Ip flows in the row direction through write digit line WDL corresponding to the selected memory cell based on the results of row selection. Thereby, data at L-level ("0") can be written into the selected memory cell.

Referring to FIG. 7 again, block group select signal/BGSL is inactivated to attain H-level in the unselected memory cell blocks belonging to the same bank so that select transistor switches 200, 240a and 240b are turned on. Each of sub-column select signals SCSL1 and SCSL2 is inactivated to attain L-level so that each of select transistor switches 210a, 220a, 210b, 220b, 230a and 230b is turned off.

Thereby, in the unselected memory cell blocks, each of sub-write bit lines SWBL1 and SWBL2 is electrically disconnected from main write bit line MWBL, and is fixed to ground voltage Vss. Therefore, in the unselected memory cell blocks belonging to the same bank, the data write current in the column direction does not flow through sub-write bit line SWBL neighboring to magnetic tunnel junction MTJ, and is detoured to flow through main write bit line MWBL remote from magnetic tunnel junction MTJ. In the data read operation, each sub-write bit line SWBL is inactivated, and the opposite ends thereof are set to ground voltage Vss.

Owing to the above structure, erroneous data writing into the MTJ memory cell belonging to the unselected memory cell block can be prevented in the bank including the selected memory cell.

Modification of Second Embodiment

Figure 10:
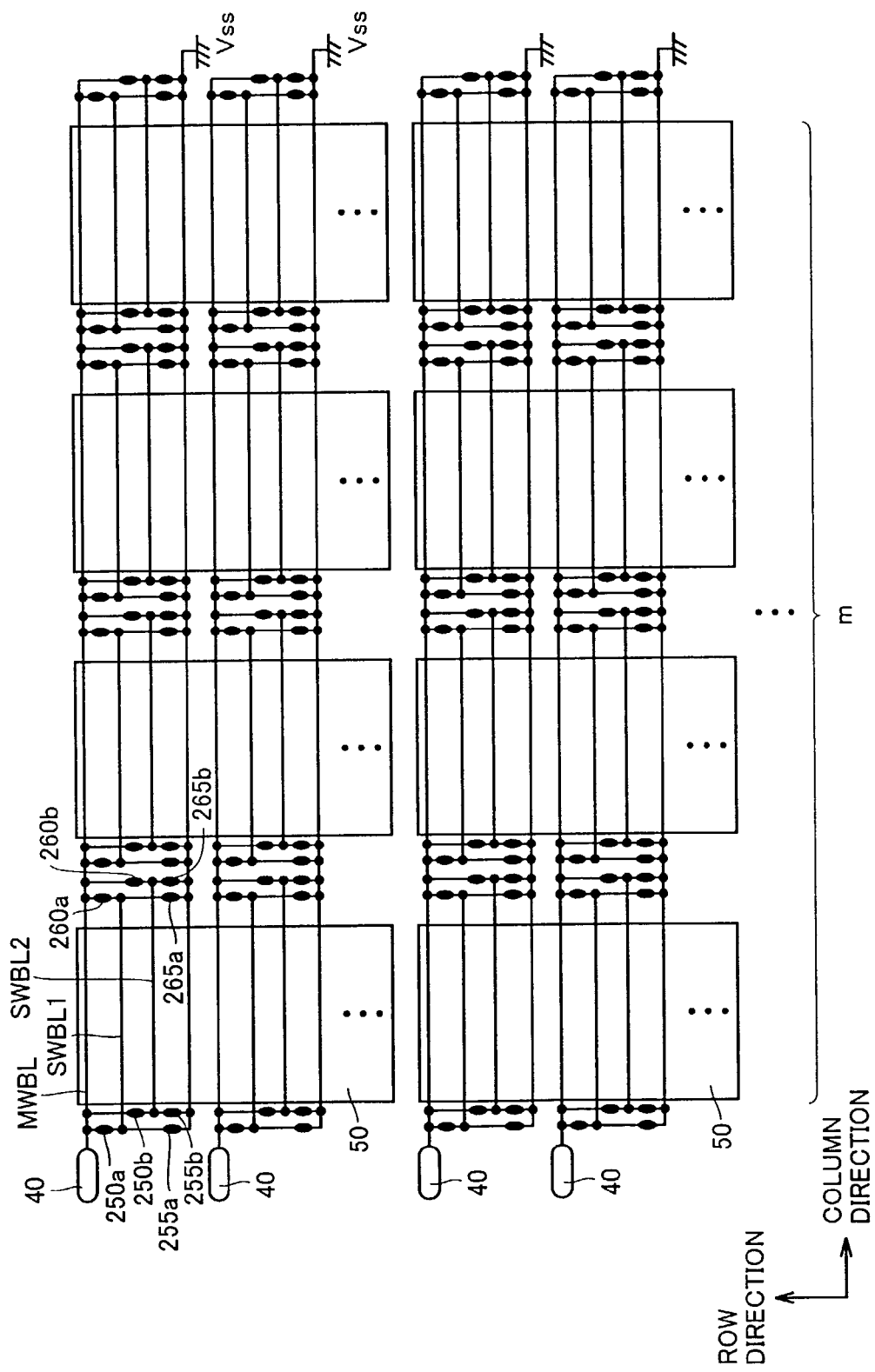
FIG. 10 is a block diagram showing a hierarchical arrangement of the main write bit lines and sub-write bit lines according to a modification of the second embodiment.

Referring to FIG. 10, a structure according to a modification of the second embodiment does not employ write bit line drivers 31 and 36, which are arranged on the opposite ends of main write bit line MWBL, respectively, and alternatively employs a write bit line driver 40 only on one end of each main write bit line MWBL. Each memory cell block is provided with select transistor switches 250a, 255a, 250b, 255b, 260a, 265a, 260b and 265b for controlling connection of main write bit line MWBL to sub-write bit lines SWBL1 and SWBL2. These select transistor switches operate in the selected memory cell block to connect one and the other ends of sub-write bit line SWBL corresponding to the selected memory cell to main write bit line MWBL and ground voltage Vss, or vice versa in accordance with the data level of write data DIN, respectively.

Figure 11:
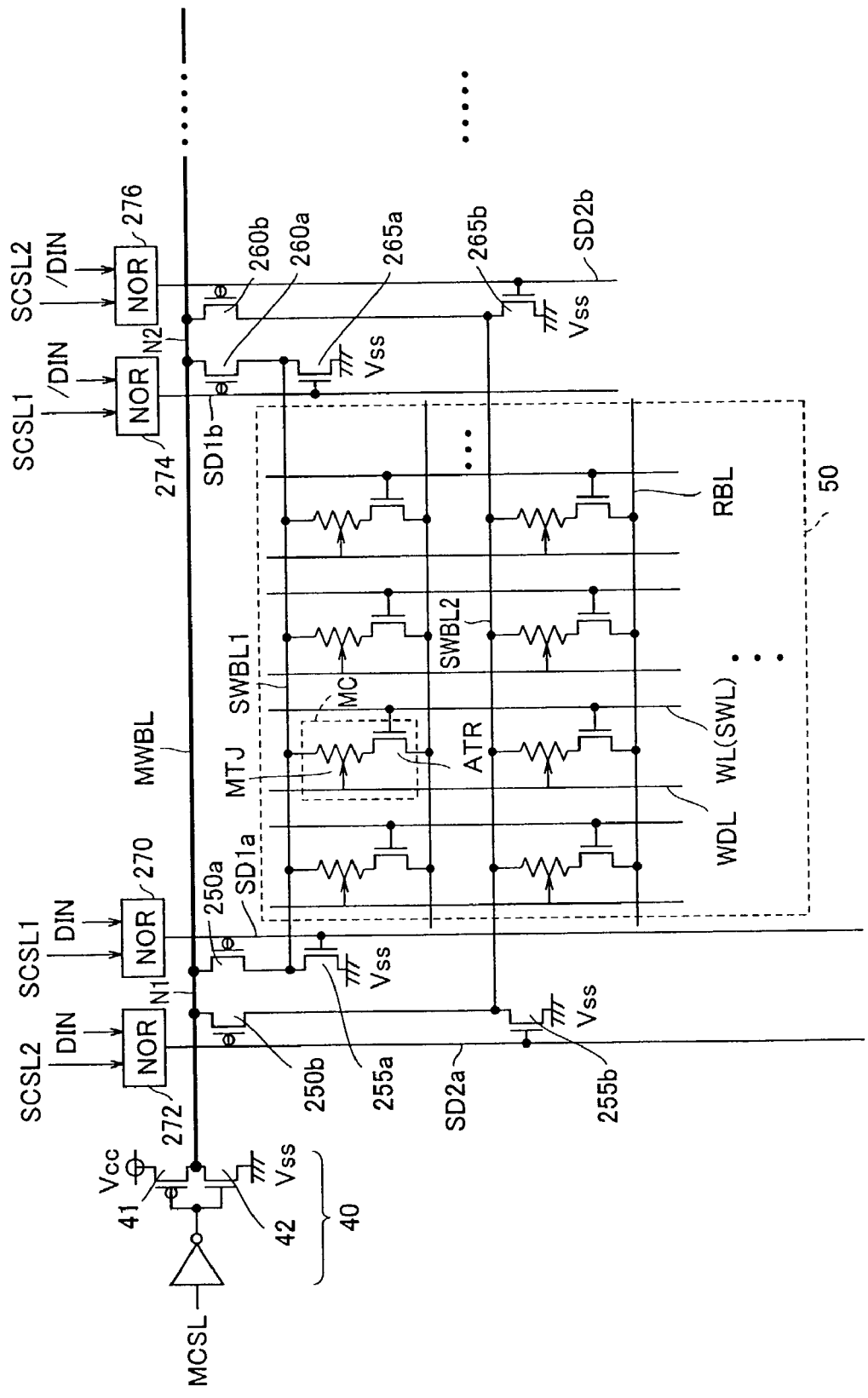
FIG. 11 is a circuit diagram specifically showing an arrangement of select switches according to the modification of the second embodiment.

FIG. 11 is a circuit diagram specifically showing an arrangement of the select switches in the modification of the second embodiment.

FIG. 11 representatively shows a structure for one main write bit line MWBL in one memory cell block.

Referring to FIG. 11, write bit line driver 40 has driver transistors 41 and 42 forming a CMOS inverter. Driver transistor 41 is a P-channel MOS transistor, and is arranged between power supply voltage Vcc and main write bit line MWBL. Driver transistor 42 is an N-channel MOS transistor, and is arranged between ground voltage Vss and main write bit line MWBL.

Each of driver transistors 41 and 42 receives on its gate an inverted signal of main column select signal MCSL for selecting main write bit line MWBL. Therefore, driver transistor 42 connects the unselected main write bit line to ground voltage Vss. Also, driver transistor 41 connects selected main write bit line MWBL to power supply voltage Vcc.

In the modification of the second embodiment, it is not necessary to switch the setting of the voltages on the opposite ends of main write bit line MWBL in accordance with the write data, as will be apparent later. Therefore, it is possible to employ a structure, in which each main write bit line MWBL is always charged to power supply voltage Vcc. However, such a structure may be employed that each main write bit line MWBL is connected to power supply voltage Vcc in accordance with the main column select signal (column selection results) as will be described above, and thereby main write bit line MWBL short-circuited to another interconnection can be repaired by replacing it with a spare main write bit line.

Logic gate 270 outputs results of logical NOR between sub-column select signal SCSL1 and write data DIN as a select signal SD1a. Logic gate 272 outputs results of logical NOR between sub-column select signal SCSL2 and write data DIN as a select signal SD2a. Logic gate 274 outputs results of logical NOR between sub-column select signal SCSL1 and write data /DIN as a select signal SD1b. Logic gate 276 outputs results of logical NOR between sub-column select signal SCSL2 and write data /DIN as a select signal SD2b.

When sub-write bit line SWBL1 corresponds to the selected memory cell, and thus is selected, select signals SD1a and SD1b are therefore set to H- and L-levels or L- and H-levels in accordance with write data DIN, respectively.

When sub-write bit line SWBL1 does not correspond to the selected memory cell, and thus is not selected, corresponding sub-column select signal SCSL1 is set to L-level, and each of select signals SD1a and SD1b is set to L-level. Select signals SD2a and SD2b are set similarly.

Select transistor switch 250a is formed of a P-channel MOS transistor, and is arranged between one end of sub-write bit line SWBL1 and node N1 on main write bit line MWBL. Select transistor switch 255a is formed of an N-channel MOS transistor, and is arranged between one end of sub-write bit line SWBL1 and ground voltage Vss. Select transistor switches 250a and 255a form one CMOS driver. Each of select transistor switches 250a and 255a receives select signal SD1a on its gate.

Select transistor switch 260a is formed of a P-channel MOS transistor, and is arranged between the other end of sub-write bit line SWBL1 and node N2 on main write bit line MWBL. Select transistor switch 265a is formed of an N-channel MOS transistor, and is arranged between the other end of sub-write bit line SWBL1 and ground voltage Vss. Select transistor switches 260a and 265a form one CMOS driver. Each of select transistor switches 260a and 265a receive select signal SD1b on its gate.

Select transistor switch 250b is formed of a P-channel MOS transistor, and is arranged between one end of sub-write bit line SWBL2 and node N1. Select transistor switch 255b is formed of an N-channel MOS transistor, and is arranged between one end of sub-write bit line SWBL2 and ground voltage Vss. Select transistor switches 250b and 255b form one CMOS driver. Each of select transistor switches 250b and 255b receives select signal SD2a on its gate.

Select transistor switch 260b is formed of a P-channel MOS transistor, and is arranged between the other end of sub-write bit line SWBL2 and node N2. Select transistor switch 265b is formed of an N-channel MOS transistor, and is arranged between the other end of sub-write bit line SWBL2 and ground voltage Vss. Select transistor switches 260b and 265b form one CMOS driver. Each of select transistor switches 260b and 265b receives select signal SD2 on its gate.

Figure 12:
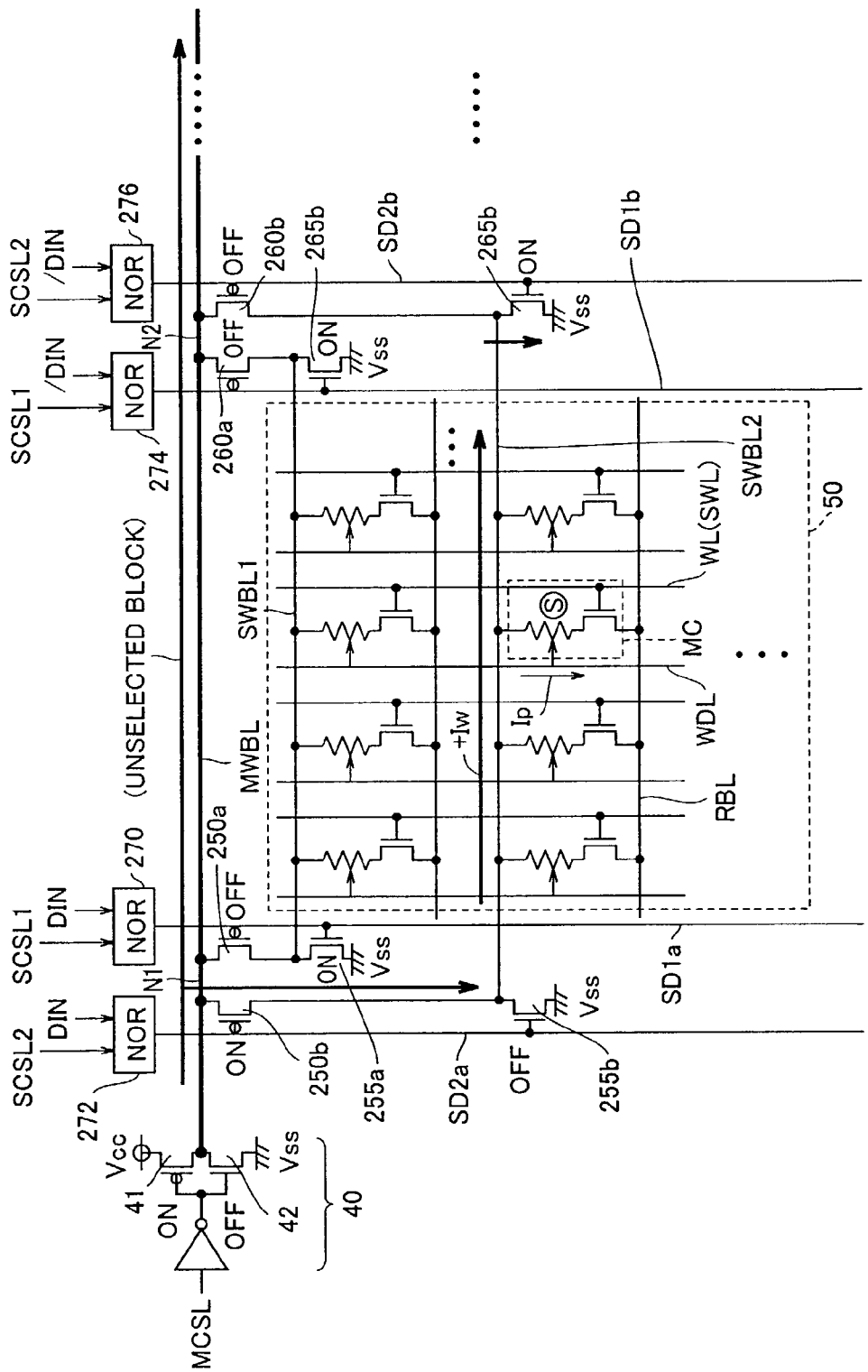
FIGS. 12 and 13 are circuit diagrams showing a path of the data write current in the column direction within the selected memory cell block according to the modification of the second embodiment.

FIG. 12 shows a current path of data write current +Iw used for writing data at H-level ("1") into the selected memory cell indicated by "S" in the figure.

Referring to FIG. 12, write bit line driver 40 connects main write bit line MWBL corresponding to the selected memory cell to power supply voltage Vcc in response to the activation (H-level) of main column select signal MCSL. For selecting sub-write bit line SWBL2, sub-column select signal SCSL2 is set to H-level, and sub-column select signal SCSL1 is set to L-level.

Therefore, each of select signals SD1a and SD1b output from logic gates 270 and 274 is set to H-level. Since write data DIN is at H-level, select signals SD2a and SD2b output from logic gates 272 and 276 are set to L- and H-levels, respectively.

For unselected sub-write bit line SWBL1, therefore, select transistor switches 255a and 265a are turned on, and select transistor switches 250a and 260a are turned off. Thereby, sub-write bit line SWBL1 is electrically disconnected from main write bit line MWBL, and is coupled at its opposite ends to ground voltage Vss.

For the selected sub-write bit line SWBL2, select transistor switches 250b and 265b are turned on, and select transistor switches 255b and 260b are turned off. Thereby, one end of sub-write bit line SWBL2 is coupled to main write bit line MWBL, which is set to power supply voltage Vcc by select transistor switch 250b. The other end of sub-write bit line SWBL2 is coupled to ground voltage Vss by select transistor switch 265b. Therefore, data write current +Iw for writing write data DIN at H-level flows through selected sub-write bit line SWBL2.

Further, data write current Ip is passed in the row direction through write digit line WDL corresponding to the selected memory cell, whereby data at H-level can be written into the selected memory cell.

Figure 13:
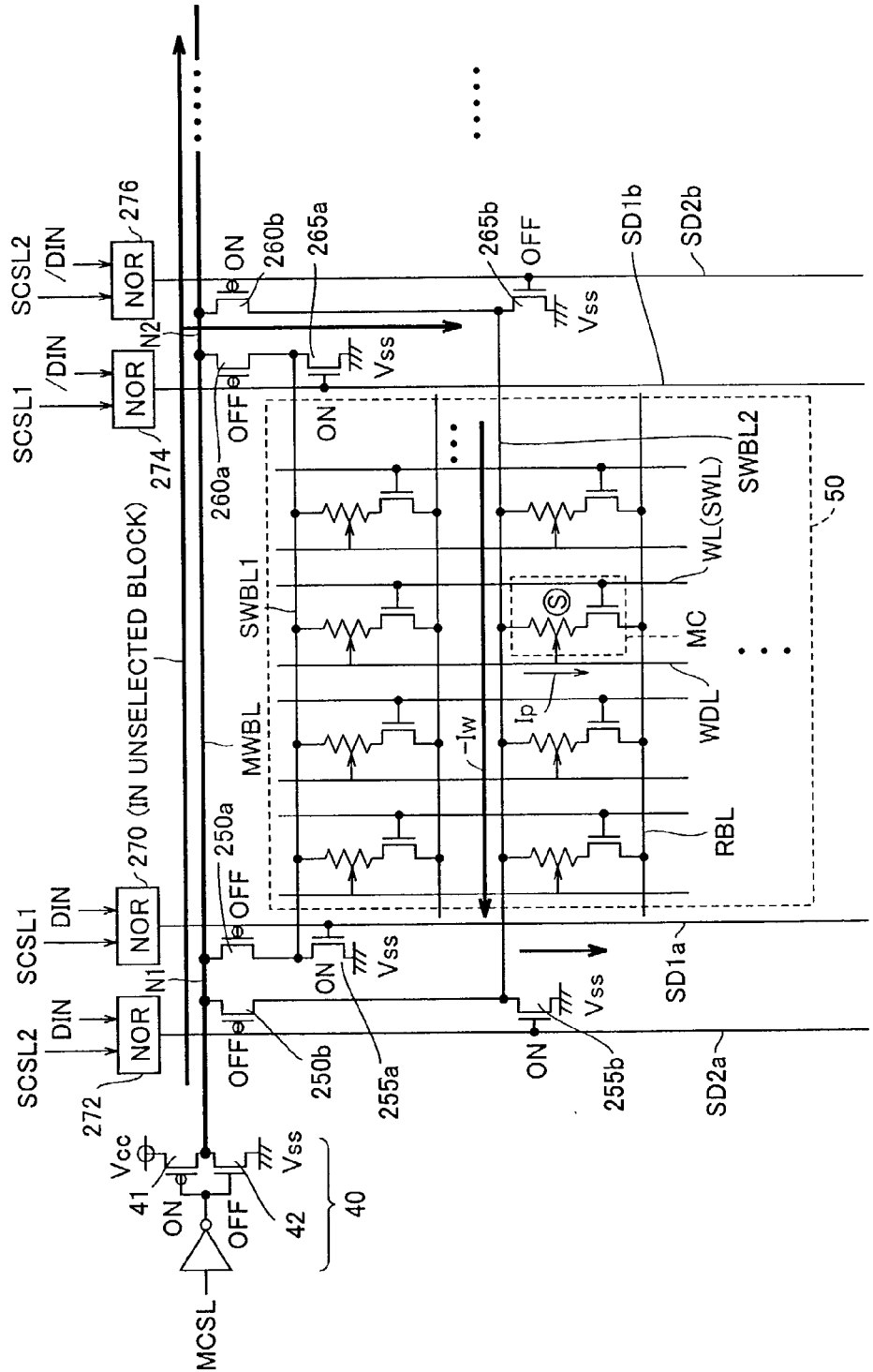

FIG. 13 shows a current path of data write current +Iw used for writing data at L-level ("0") into the selected memory cell indicated by "S" in the figure.

Referring to FIG. 13, write bit line driver 40 connects main write bit line MWBL corresponding to the selected memory cell to power supply voltage Vcc, similarly to the case shown in FIG. 12.

Also, sub-column select signal SCSL2 is set to H-level, and sub-column select signal SCSL1 is set to L-level, similarly to the case shown in FIG. 12. Therefore, each of select signals SD1a and SD1b output from logic gates 270 and 274 is set to H-level. Therefore, select transistor switches 250a, 255a, 260a and 265a electrically disconnect unselected sub-write bit line SWBL1 from main write bit line MWBL, and couple the opposite ends thereof to ground voltage Vss.

Since write data DIN is at L-level, select signals SD2a and SD2b output from logic gates 272 and 276 are set to H- and L-levels, respectively, in contrast to the case shown in FIG. 12. For the selected sub-write bit line SWBL2, therefore, select transistor switches 250b and 265b are turned off, and select transistor switches 255b and 265b are turned on. Thereby, select transistor switch 255b couples one end of sub-write bit line SWBL2 to ground voltage Vss. Also, select transistor switch 260b couples the other end of sub-write bit line SWBL2 to main write bit line MWBL set to power supply voltage Vcc. As a result, data write current −Iw for writing write data DIN at L-level flows through selected sub-write bit line SWBL2 in the direction opposite to that shown in FIG. 12.

Through write digit line WDL corresponding to the selected memory cell, data write current Ip flows in the row direction so that data at L-level can be written into the selected memory cell.

Referring to FIG. 11 again, corresponding sub-column select signals SCSL1 and SCSL2 in the unselected memory cell block are both inactivated to attain L-level so that each of select signals SD1a, SD1b, SD2a and SD2b is set to H-level.

In the unselected memory cell block, therefore, each of select transistor switches 250a, 250b, 260a and 260b is turned off, and each of select transistor switches 255a, 255b, 265a and 265b is turned on. Thereby, each of sub-write bit lines SWBL1 and SWBL2 is disconnected from main write bit line MWBL, and the opposite ends thereof are set to ground voltage Vss. In the data read operation, each sub-write bit line SWBL is likewise inactivated, and the opposite ends thereof are set to ground voltage Vss.

Owing to the above structure, data write current ±Iw in the column direction having the direction corresponding to the level of the write data can be supplied to only sub-write bit line SWBL, which corresponds to the selected memory cell, among sub-write bit lines SWBL subdivided in each memory block. Thus, the data write current in the column direction does not flow through the unselected sub-write bit line SWBL.

Compared with the structure according to the second embodiment, the write bit line driver is arranged only on one side of main write bit line MWBL so that the circuit area of the peripheral portion of the memory array can be reduced. Further, data write current ±Iw in the column direction does not flow through a portion of the selected main write bit line, which extends away from the selected memory cell block and is remote from the write bit line driver 40.

Compared with the structure according to the second embodiment, therefore, it is possible to reduce further the region, where the data write current in the column direction flows. Therefore, erroneous data writing into the unselected memory cell can be prevented further reliably.

In the foregoing structure of this embodiment, two sub-write bit lines SWBL correspond to one main write bit line MWBL. However, the invention is not restricted to this structure. Three or more sub-write bit lines may correspond to one main write bit line MWBL. In this case, sub-column select signals SCSL1 and SCSL2 as well as the select transistor switches already described with reference to FIGS. 7 and 11 are arranged in a similar manner with respect to each sub-write bit line SWBL.

The first embodiment may be combined with the second embodiment or the modification thereof to provide a structure, in which both the data write currents in the row and column directions flow only through required minimum ranges. By this structure, it is possible to prevent more reliably the erroneous data writing into the unselected memory cell other than the selected memory cell.

Third Embodiment

A third embodiment provides a structure for efficiently conducting a test of a resistance to erroneous data writing on each MTJ memory cell. In the following description, an operation test for evaluating a resistance to erroneous data writing will be referred to as a "disturb test".

Figure 14:
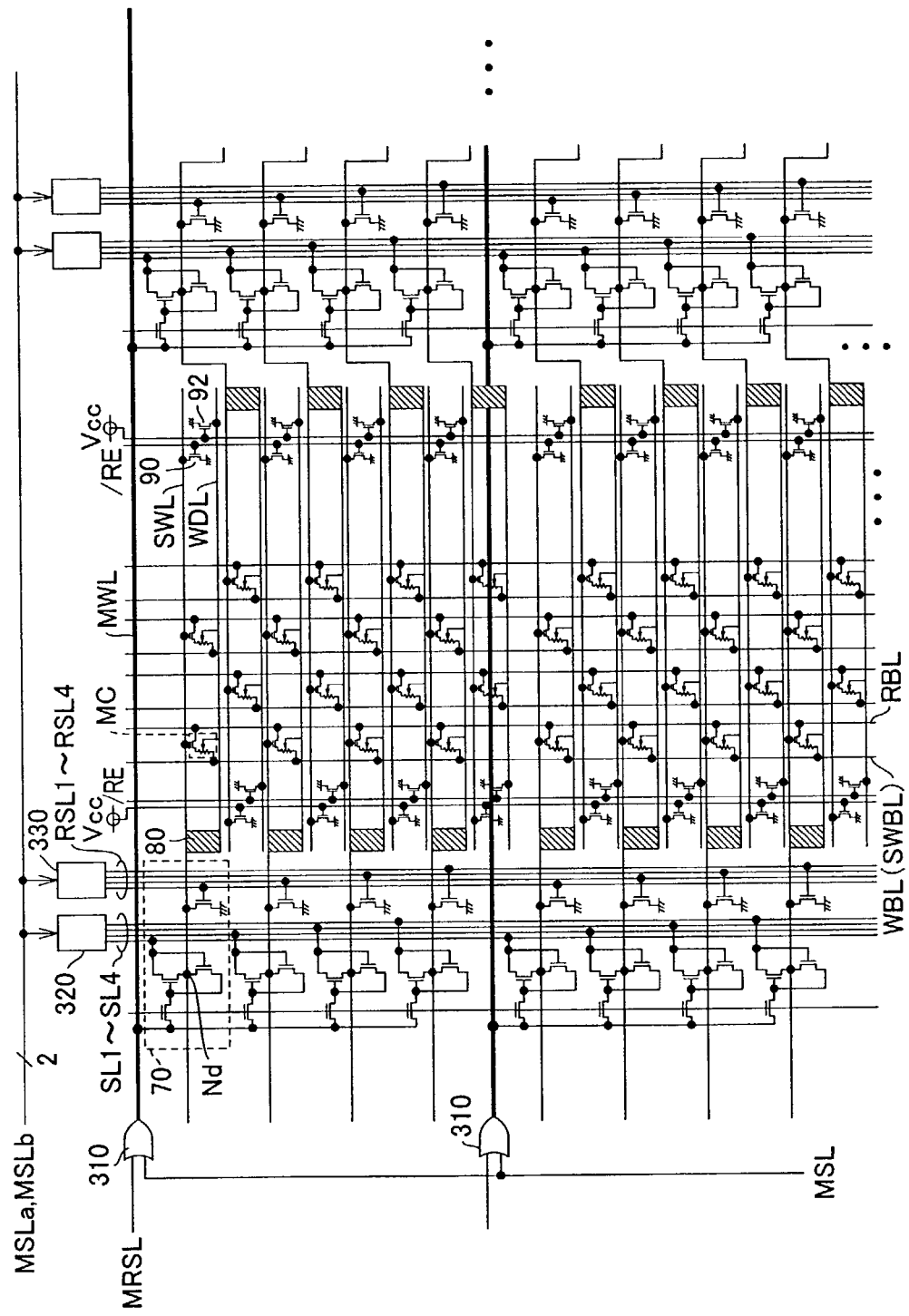
FIG. 14 is a circuit diagram showing an arrangement of circuits related to row selection in a disturb test according to a third embodiment.

FIG. 14 is a circuit diagram showing an arrangement of circuits related to the row selection in the disturb test according to the third embodiment.

Referring to FIG. 14, a structure according to the third embodiment includes multi-selection gates 310 and multi-selection control circuits 320 and 330 for executing "row multi-selection", i.e., parallel activation of the plurality of memory cell rows in the disturb test of the hierarchical word line structure according to the first embodiment.

Multi-selection gates 310 are arranged corresponding to main word lines MWL, respectively, and each can output results of logical OR between a row select signal MRSL (decoding results) activating the corresponding main word line and a multi-selection signal MSL. Multi-selection signal MSL is active and kept at H-level in the disturb test. Each main word line MWL is selectively activated in accordance with the output of corresponding multi-selection gate 310. In response to activation of multi-selection signal MSL, therefore, each main word line MWL is activated to attain the selected state (power supply voltage Vcc).

Multi-selection control circuits 320 and 330 are arranged for each bank. Multi-selection control circuits 320 and 330 receive multi-selection signals MSLa and MSLb. Multi-selection control circuit 320 controls the activation of select lines SL1–SL4 in the corresponding bank. Multi-selection control circuit 330 controls activation of reset lines RSL1–RSL4 in the corresponding bank.

Figure 15:
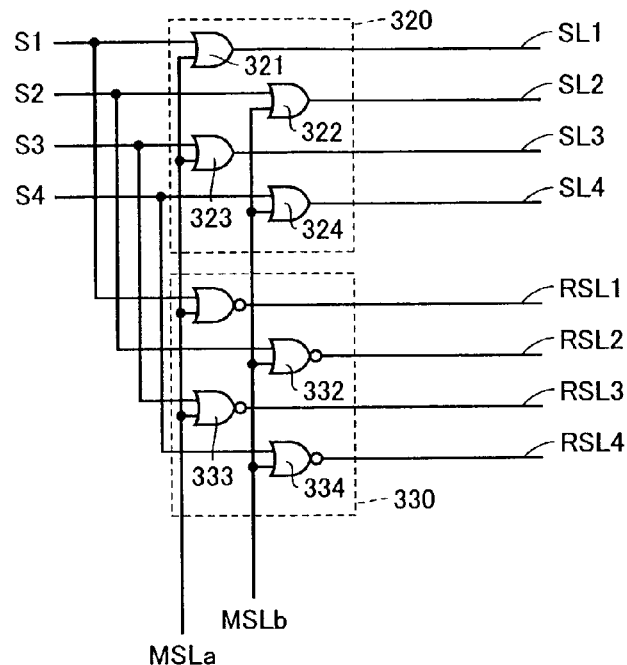
FIG. 15 is a circuit diagram showing a structure of a multi-selection control circuit shown in FIG. 14.

FIG. 15 is a circuit diagram showing structures of multi-selection control circuits 320 and 330.

Referring to FIG. 15, decode signals S1–S4 correspond to select lines SL1–SL4, and are set to H-level when corresponding select lines are to be activated, respectively.

Multi-selection control circuit 320 includes a logic gate 321 for outputting results of logical OR between decode signal S1 and multi-selection signal MSLa, a logic gate 322 for outputting results of logical OR between decode signal S2 and multi-selection signal MSLb, a logic gate 323 for outputting results of logical OR between decode signal S3 and multi-selection signal MSLa, and a logic gate 324 for outputting results of logical OR between decode signal S4 and multi-selection signal MSLb. Select lines SL1–SL4 are driven by the outputs of logic gates 321–324, respectively.

Multi-selection control circuit 330 includes a logic gate 311 for outputting results of logical NOR between decode signal S1 and multi-selection signal MSLa, a logic gate 332 for outputting results of logical NOR between decode signal S2 and multi-selection signal MSLb, a logic gate 333 for outputting results of logical NOR between decode signal S3 and multi-selection signal MSLa, and a logic gate 334 for outputting results of logical NOR between decode signal S4 and multi-selection signal MSLb. Reset lines RSL1–RSL4 are driven by the outputs of logic gates 331–334, respectively.

Owing to the above structure, each select line SL and corresponding reset line RSL are activated complementarily to each other. When activating multi-selection signal MSLa, select lines SL1 and SL3 are forcedly activated to attain H-level, and reset lines RSL1 and RSL3 are forced inactivated to attain L-level. When activating multi-selection signal MSLb, select lines SL2 and SL4 are forcedly activated to attain H-level, and reset lines RSL2 and RSL4 are forcedly inactivated to attain L-level.

When both multi-selection signals MSLa and MSLb are activated, all select lines SL1–SL4 are forcedly activated. When both multi-selection signals MSLa and MSLb are inactivated, one of select lines SL1–SL4 is activated in accordance with results of row selection.

According to the structure of the third embodiment, therefore, a plurality of write digit lines WDL can be activated in parallel to pass in the row direction the data write current in accordance with multi-selection signals MSLa and MSLb. When one of multi-selection signals MSLa and MSLb is activated, a half of write digit lines WDL on the memory array can be activated in parallel. In particular, alternate write digit lines WDL can be activated by alternately activating multi-selection signals MSLa and MSLb. When both multi-selection signals MSLa and MSLb are inactivated, a quarter of write digit lines WDL on the memory array can be activated in parallel.

Figure 16:
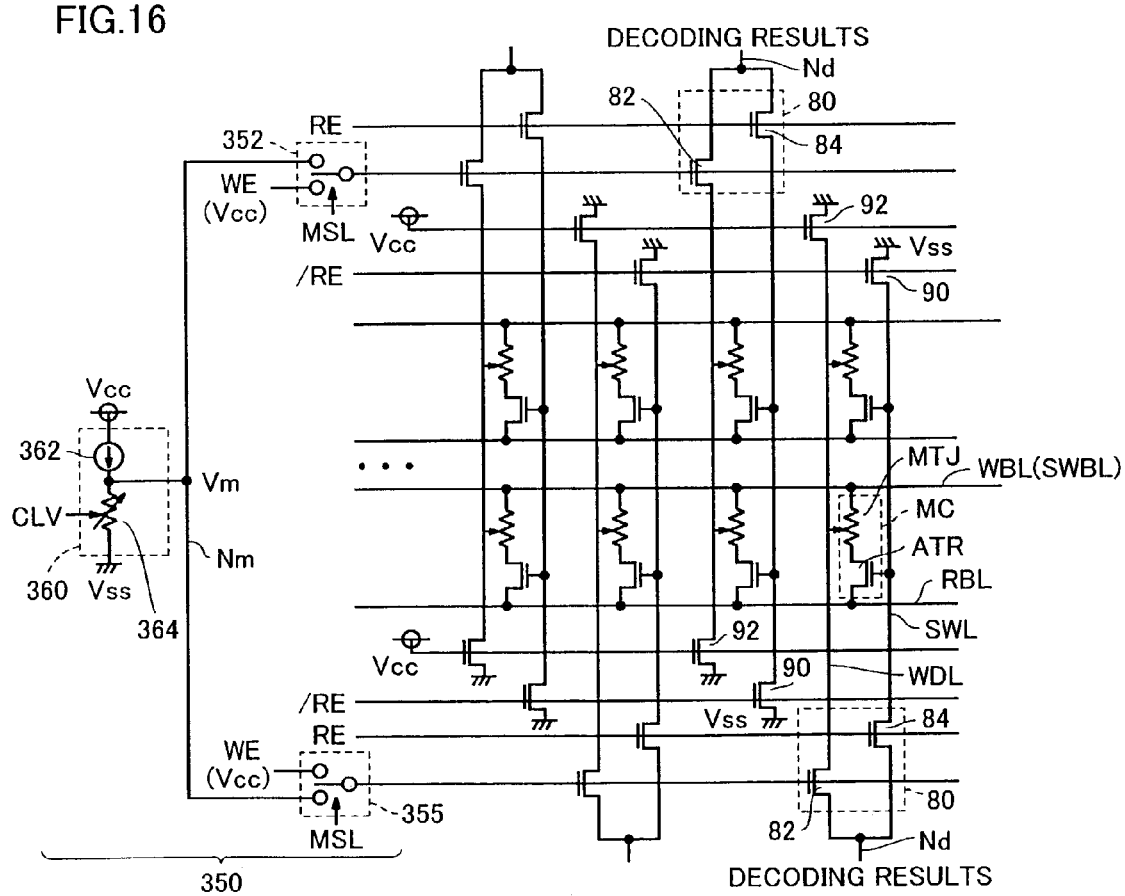
FIG. 16 is a circuit diagram showing a structure of a sub-decoder band according to the third embodiment.

FIG. 16 is a circuit diagram showing a structure of a sub-decoder band according to a third embodiment.

Referring to FIG. 16, the structure according to the third embodiment differs from those of the foregoing embodiments in that a test current supply circuit 350 is arranged for passing an intermediate data write current Ipt through write digit line WDL in the disturb test by using sub-row decoder 80 shown in FIG. 4.

Test current supply circuit 350 includes select switches 352 and 355 for switching the gate voltage on transistor switch 82 in the sub-row decoder as well as an intermediate voltage generating circuit 360.

Select switches 352 and 355 are controlled in response to multi-selection signal MSL. In the normal operation, select switches 352 and 355 couple the gate of transistor switch 82 in sub-row decoder 80 to a node receiving control signal WE. In the disturb test, select switches 352 and 355 couple the gate of transistor switch 82 to a node Nm.

Intermediate voltage generating circuit 360 includes a current supply 362 coupled between power supply voltage Vcc and node Nm, and a variable resistance 364 connected between node Nm and ground voltage Vss. Control signal CLV can control a resistance value of variable resistance 364. Therefore, intermediate voltage generating circuit 360 generates an intermediate voltage Vm (Vcc>Vm>Vss) corresponding to control signal CLV on node Nm.

Owing to the above structure, the gate voltage of transistor switch 82 in sub-row decoder 80 is set to power supply voltage Vcc corresponding to the active state of control signal WE in the normal operation. In this state, regular data write current Ip flows through active write digit line WDL in accordance with the voltage on node Nd. In the disturb test, intermediate data write current Ipt corresponding to intermediate voltage Vm flows through write digit line WDL, which is activated in response to the multi-selection signal.

Figure 24:
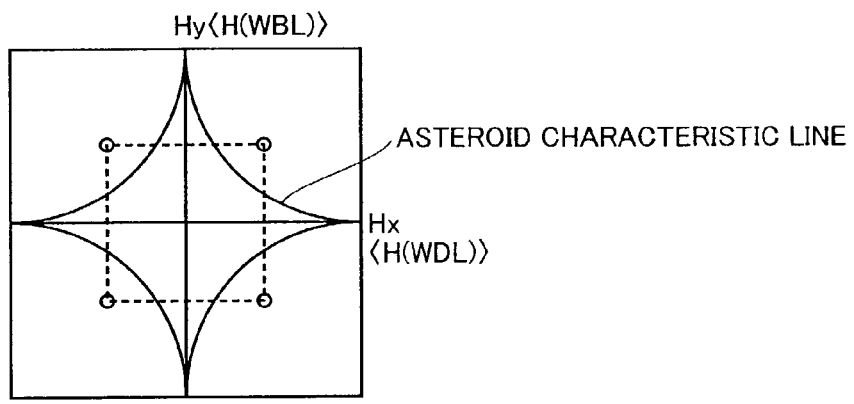
FIG. 24 conceptually shows a relationship between a direction of a data write current and a magnetization direction of a free-magnetic layer.
Figure 25:
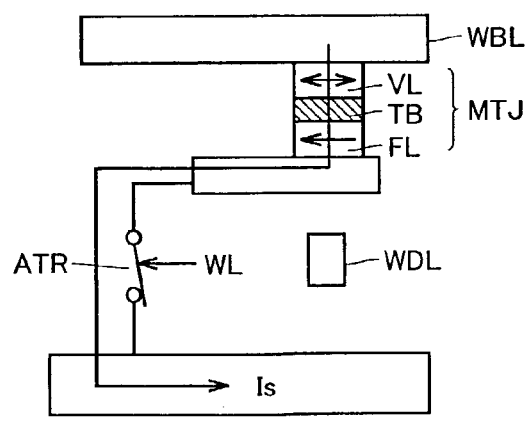
FIG. 25 conceptually shows a data read operation for the MTJ memory cell.

Regular data write current Ip is set to a level allowing application of a data write magnetic field, which corresponds to a region outside the asteroid characteristic line in FIG. 24, to magnetic tunnel junction MTJ. However, the data write magnetic field, which is applied to magnetic tunnel junction MTJ by intermediate data write current Ipt, is controlled to correspond to a region inside the asteroid characteristic line.

In the disturb test, as described above, intermediate data write current Ipt, which disables the data writing in theory, is supplied to check whether the storage data of each MTJ memory cell data is updated or not, and thereby a test is conducted on the resistance to erroneous data writing into each MTJ memory cell. In this test, multi-selection can be executed to select in parallel a plurality of memory cell rows as disturb targets.

Alternatively, the row multi-selection based on the similar multi-selection signal may be applied to the word lines at the time of operation test. This enables execution of reliability test on electric field resistance between a word line and other node or between word lines, efficiently in a short time.

Description will now be given on the multi-selection of sub-write bit lines SWBL in the disturb test.

Figure 17:
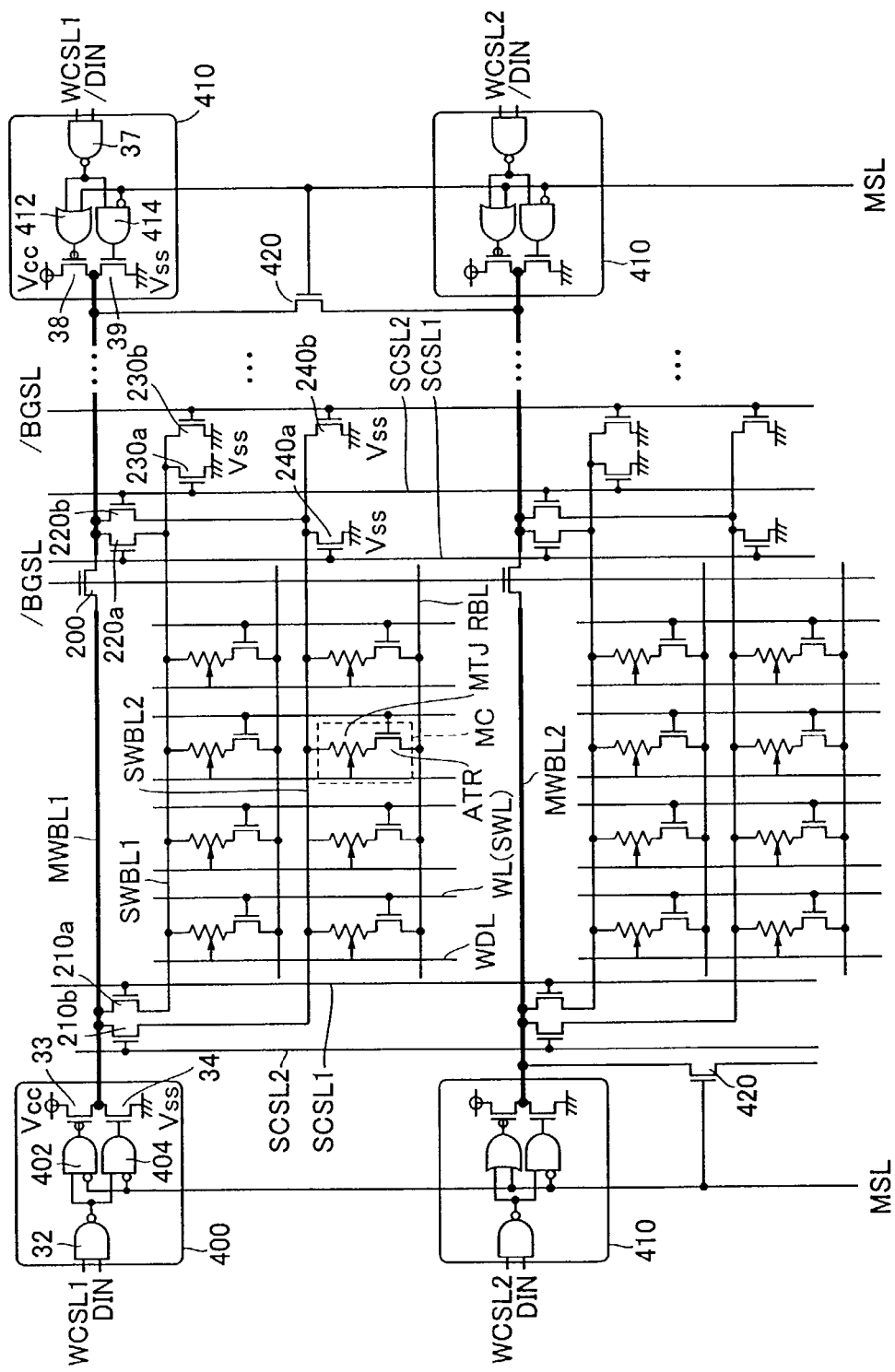
FIG. 17 is a circuit diagram showing a structure including sub-write bit lines SWBL and related to the multi-selection according to the third embodiment.

FIG. 17 is a circuit diagram showing a structure of a portion related to multi-selection of sub-write bit lines SWBL according to the third embodiment.

FIG. 17 shows a structure for executing the "column multi-selection", i.e., parallel activation of the plurality of memory cell columns in the disturb test of the structure of the second embodiment, which includes a hierarchical arrangement of the write bit lines as shown in FIG. 7.

Referring to FIG. 17, write bit line drivers 400 and 410 are employed instead of write bit line drivers 31 and 36, and are arranged on the opposite ends of main write bit line MWBL1 in the first position, respectively.

Write bit line driver 400 differs from write bit line diver 31 shown in FIG. 7 in that logic gates 402 and 404 are further employed. Logic gate 402 outputs results of logical OR between the output of logic gate 32 and multi-selection signal MSL to the gate of driver transistor 33. Logic gate 404 outputs the results of the same logical OR as that of logic gate 402 to the gate of driver transistor 34.

Accordingly, in the disturb test performed with active multi-selection signal MSL at H-level, gates of driver transistors 33 and 34 are set to L-level (ground voltage Vss). Thereby, write bit line driver 400 couples one end of main write bit line MWBL in the first or leading position to power supply voltage Vcc. In the normal operation, multi-selection signal MSL is inactivated to attain L-level so that logic gates 402 and 404 transmit the output of logic gate 32 to driver transistors 33 and 34 as it is, respectively.

Write bit line driver 410 differs from write bit line driver 36 shown in FIG. 7 in that logic gates 412 and 414 are further employed. Logic gate 412 outputs results of logical OR between the output of logic gate 37 and multi-selection signal MSL to the gate of driver transistor 38. Logic gate 414 outputs results of logical AND between the output of logic gate 37 and an inverted signal of multi-selection signal MSL to the gate of driver transistor 39.

Accordingly, in the disturb test performed with active multi-selection signal MSL at H-level, the outputs of logic gates 412 and 414 are fixed to H- and L-level, respectively. Therefore, each of driver transistors 38 and 39 is turned off. In the normal operation, multi-selection signal MSL is inactive and at L-level so that logic gates 412 and 414 transmit the output of logic gate 37 to the gates of driver transistors 38 and 39, respectively.

The write bit line drivers arranged on the opposite ends of each of subsequent main word lines MWL except for the last main write bit line have the same structure as main write bit line driver 410. Therefore, each of main write bit lines MWBL is connected to neither power supply voltage Vcc nor ground voltage Vss in the disturb test, and is set to a floating state.

Further, a multi-selection control switch 420 is employed for short-circuiting main write bit lines MWBL neighboring to each other. Main write bit lines MWBL neighboring to each other are electrically joined together by multi-selection control switch 420 in response to activation of multi-selection signal MSL. Further, in the disturb test, either of sub-column select signal SCSL1 or SCSL2 is activated in each block group.

Figure 18:
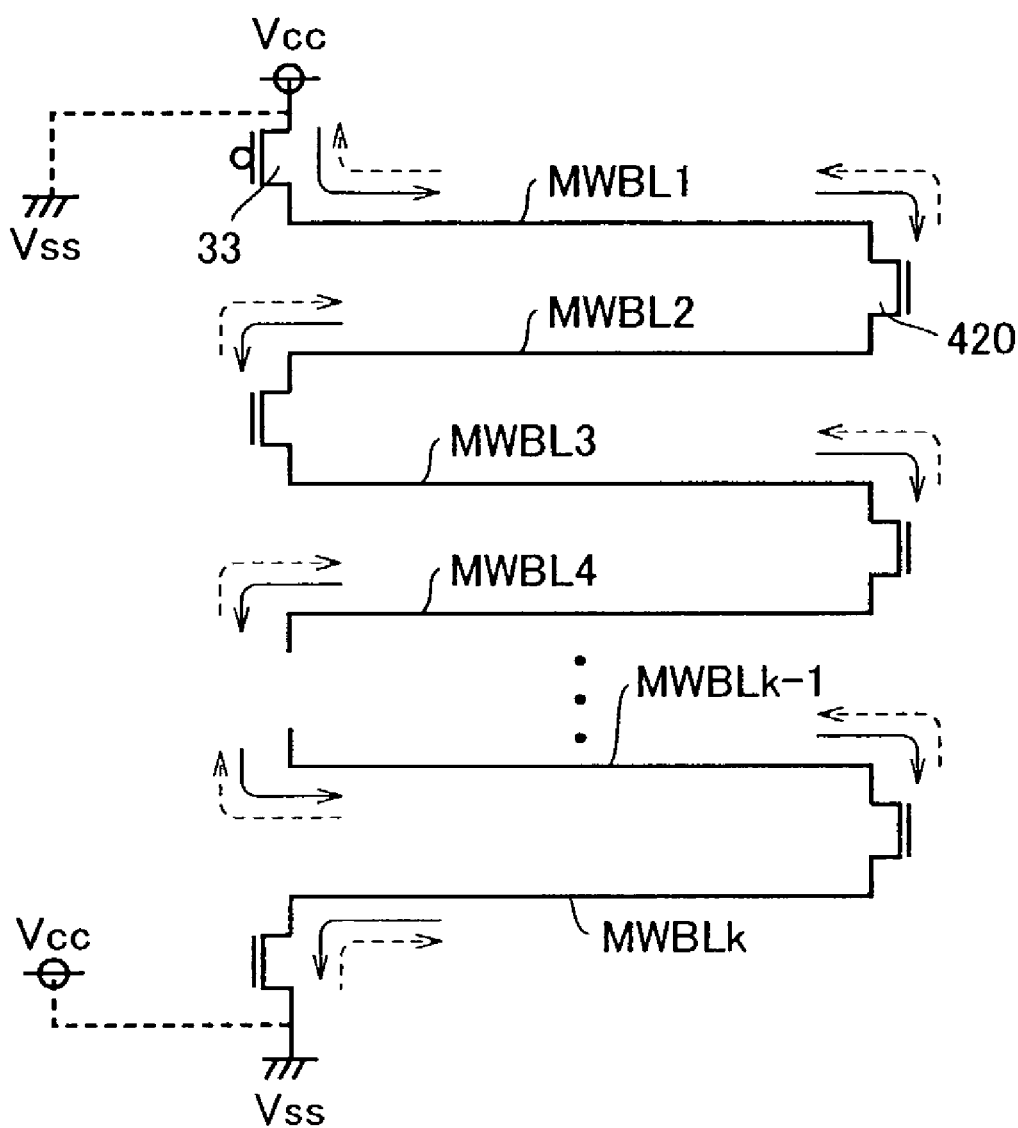
FIGS. 18 and 19 conceptually show examples of column multi-selection according to the third embodiment.

FIG. 18 conceptually shows a first example of the column multi-selection according to the third embodiment.

Referring to FIG. 18, main write bit lines MWBL1–MWBLk of k (k: natural number) in number are arranged in the whole memory array. In the disturb test, one end of main write bit line MWBL1 in the first position is connected to power supply voltage Vcc by driver transistor 33 shown in FIG. 17. Other ends of main write bit lines MWBL1 and MWBL2 are connected together by multi-selection control switch 420. Subsequent main write bit lines MWBL are connected similarly so that the ends on one side of the neighboring main write bit lines MWBL are connected together in response to multi-selection signal MSL, and the ends on the other side of the neighboring main write bit lines MWBL are likewise connected together in response to multi-selection signal MSL. Further, an end of main write bit line MWBLk in the last position is coupled to ground voltage Vss.

In the operation test, as described above, the write bit line drivers and the multi-selection control switches connect main write bit lines MWBL1–MWBLk in series between power supply voltage Vcc and ground voltage Vss. Thereby, the data write current can pass in the column direction through each of main write bit lines MWBL1–MWBLk with a current consumption equal to that required for one main write bit line MWBL in the normal operation.

Thereby, in the structure employing sub-write bit lines SWBL of h (h: natural number) for one main write bit line MWBL, 1/h of all sub-write bit lines SWBL are connected in series to main write bit lines MWBL1–MWBLk, and are supplied with the data write current in the column direction. In FIG. 17, both sub-column select signals SCSL1 and SCSL2 may be activated in all the block groups, whereby the data write current can flow in the column direction can flow through all sub-write bit lines SWBL in the memory array.

Structures of the write bit line drivers corresponding to main write bit lines MWBL1 and MWBLk may be changed so that a test pattern to be executed can be switched between a first test pattern, in which main write bit lines MWBL1 and MWBLk are connected to power supply voltage Vcc and ground voltage Vss as represented by solid line in FIG. 18, respectively, and a second test pattern, in which main write bit lines MWBL1 and MWBLk are connected to ground voltage Vss and power supply voltage Vcc as represented by dotted line in FIG. 18, respectively. By this structure, the data write current can flow in the opposite directions according to the first and second test patterns, respectively. As a result, the disturb test can be conducted accurately even when the resistance to erroneous data writing into the MTJ memory cell changes depending on the polarity of storage data.

Figure 19:
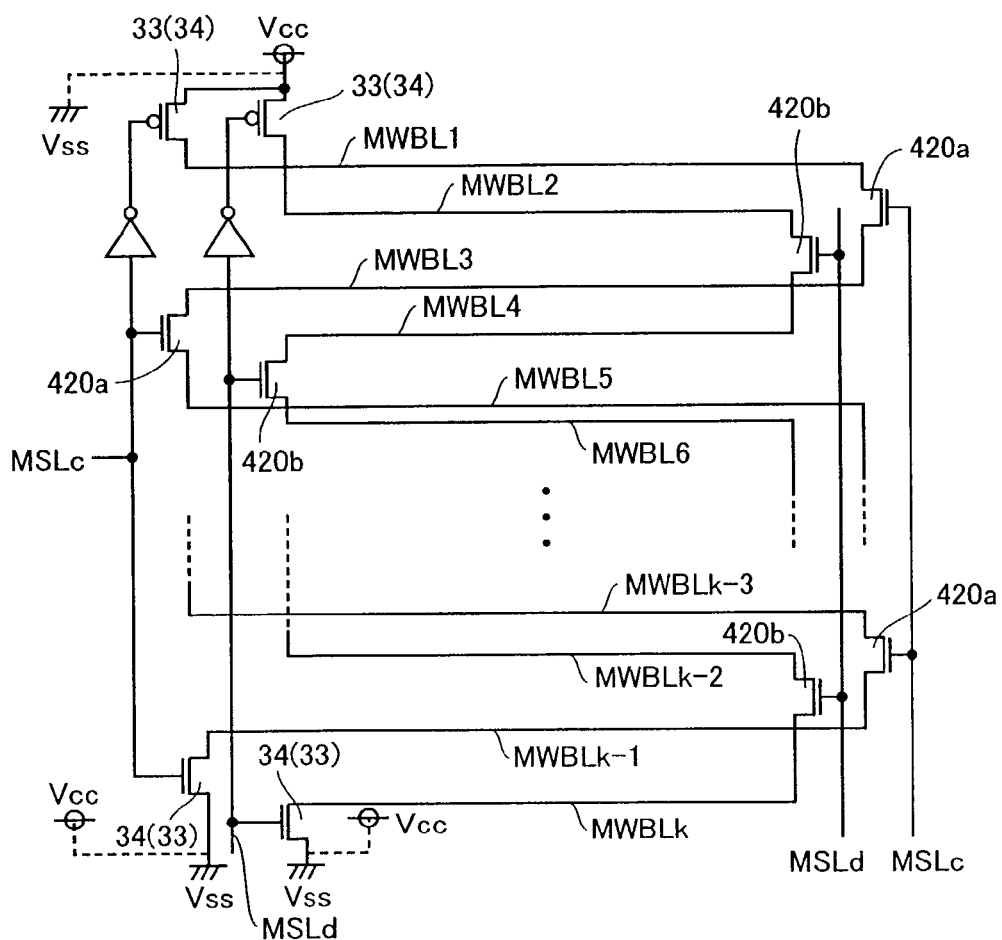

FIG. 19 conceptually shows a second example of a column multi-selection according to the third embodiment.

In FIG. 18, multi-selection control switch 420 is arranged between neighboring main write bit lines MWBL. However, the structure according to the third embodiment is not restricted to this structure. Multi-selection control switches 420 may be arranged for connecting every K (K is a natural number larger than one) main write bit lines MWBL together.

FIG. 19 shows a structure, in which K is equal to two. In this case, multi-selection control switches 420a for coupling odd-numbered main write bit lines together are controlled by a multi-selection signal MSLc, multi-selection control switches 420b for coupling even-numbered main write bit lines together are controlled by another multi-selection signal MSLd.

In the above structure, the data write current can be supplied in parallel to 1/(K×h) of sub-write bit lines SWBL in the whole memory array. In accordance with the form of arrangement of the multi-selection control switches, it is possible to determine arbitrarily the number of sub-write bit lines SWBL, through which the data write current can flow in parallel.

Figure 20:
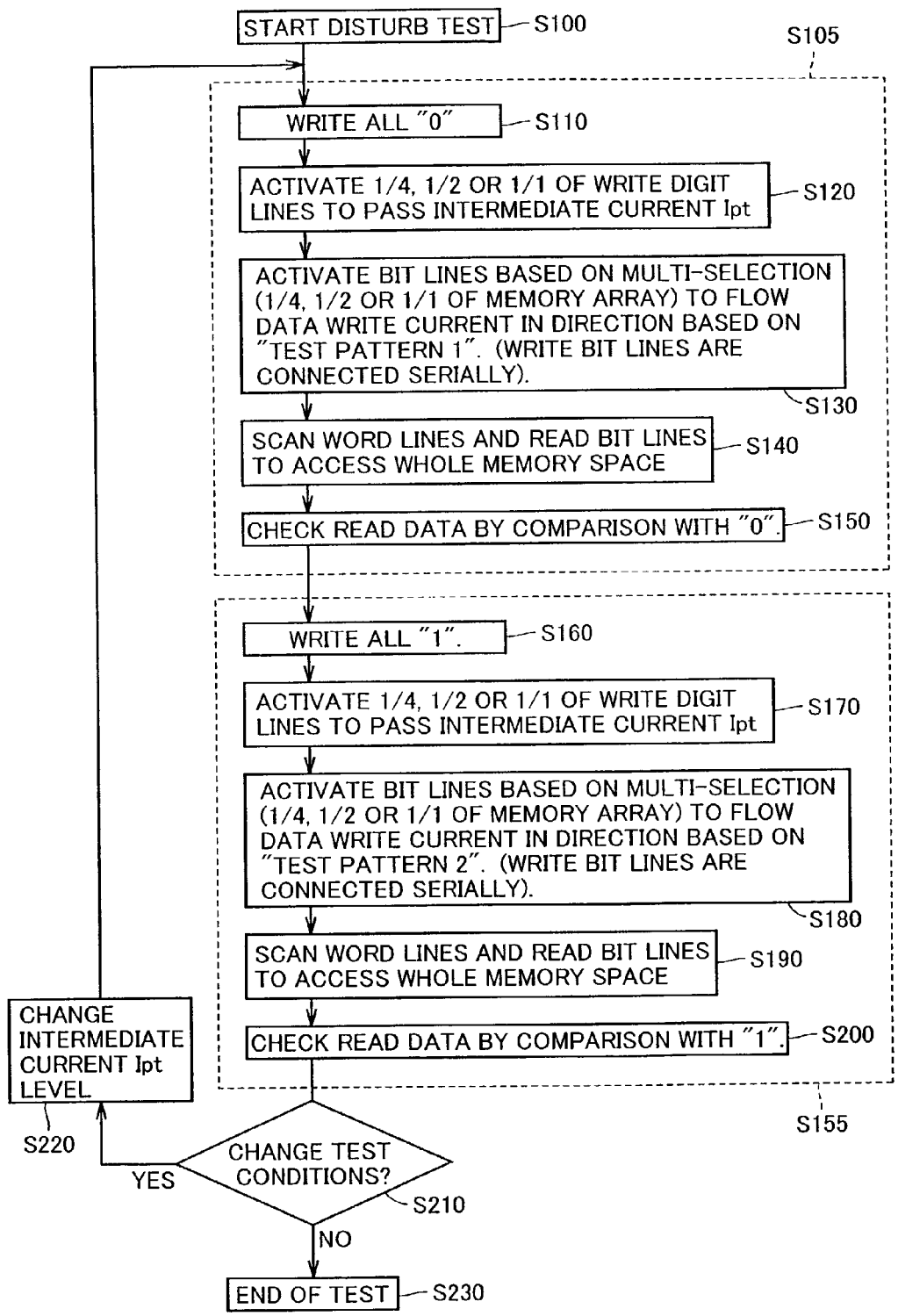
FIG. 20 is a flowchart of a disturb test according to the third embodiment.

FIG. 20 is a flowchart of a disturb test according to the third embodiment.

Referring to FIG. 20, when the disturb test starts (step S100), the disturb test based on a test pattern 1 is executed (step S105). In the test pattern 1, data of, e.g., "0 (L-level)" is first written into all the MTJ memory cells (step S110).

Then, in accordance with the setting of multi-selection signals MSLa and MSLb, a quarter, a half or all of write digit lines WDL in the whole memory array are activated in parallel, and each are supplied with intermediate data write current Ipt in the row direction (step S120). Further, first and last main write bit lines MWBL1 and MWBLk are connected to power supply voltage Vcc and ground voltage Vss, respectively. While keeping this state, a quarter, a half or all of sub-write bit lines SWBL in the whole memory array are activated, and are supplied with the data write current in the column direction and particularly in the direction depending on the test pattern 1. In this case, as already described with reference to FIGS. 18 and 19, the data write current in the column direction flows through a current path, in which activated main write bit line MWBL and sub-write bit line SWBL are connected in series between power supply voltage Vcc and ground voltage Vss (step S130).

The direction of the data write current in the column direction according to the test pattern 1 is determined to rewrite the data written in step S110. When data of "0 (L-level)" is written in step S110, the data write current in the column direction according to the test pattern 1 is determined to write "1 (H-level)".

When supply of the data write current ends, sub-word lines SWL are successively scanned to detect the voltages on the corresponding read bit lines, and thereby access to the whole memory space is executed (step S140). Thereby, it is checked whether false data writing performed in steps S120 and S130 caused erroneous rewriting of the storage data in each MTJ memory cell or not (step S150).

For executing the disturb test of the polarity opposite to that according to the test pattern 1, the disturb test according to the test pattern 2 is executed (step S155). According to the test pattern 2, the data (e.g., data of "1 (H-level)") of the polarity opposite to that in step S110 is written into all the MTJ memory cells (step S160).

Then, similarly to step S120, a quarter, a half or all of write digit lines WDL in the whole memory array are activated in parallel, and each are supplied with intermediate data write current Ipt in the row direction (step S170). Further, first and last main write bit lines MWBL1 and MWBLk are connected to ground voltage Vss and power supply voltage Vcc in contrast to step S130, respectively. While keeping this state, a quarter, a half or all of sub-write bit lines SWBL in the whole memory array are activated, and the data write current in the column direction flows in the direction according to the test pattern 2. Similarly to step S130, the data write current in the column direction flows through a current path, in which main and sub-write bit lines MWBL and SWBL in the active state are connected in series between power supply voltage Vcc and ground voltage Vss (step S180).

The direction of the data write current in the column direction according to the test pattern 2 is determined to rewrite the data written in step S160. When data of "1 (H-level)" is written in step S160, the data write current in the column direction according to the test pattern 2 is determined to write "0 (L-level)".

When supply of the data write current ends, access to the whole memory space is executed similarly to step S140 (step S190). Thereby, it is checked whether the false data writing in steps S170 and 180 caused erroneous rewriting of the storage data in each MTJ memory cell or not (step S200).

When the test conditions are to be changed (step S210), the value of intermediate voltage Vm shown in FIG. 16 is changed to increase or decrease intermediate data write current Ipt, and a similar test is repeated under more or less severe conditions. When all the tests under predetermined test conditions (data write current Ipt) are completed, the disturb test ends (step S220).

According to the structure of the third embodiment described above, the disturb test for evaluating the resistance to the erroneous data writing into the MTJ memory cell can be efficiently conducted in parallel on a large number of MTJ memory cells in a short time.

Further, the data write current in the column direction is supplied through the current path, in which main and sub-write bit lines MWBL and SWBL in the active state are connected in series, and this structure allows parallel activation of the plurality of memory cell columns in the disturb test so that increase in power consumption can be suppressed.

Alternatively, an operation test may be executed with a plurality of main write bit lines selected in accordance with column multi-selection connected to same voltages (power supply voltage Vcc to Vcc, or ground voltage Vss to Vss). This enables evaluation of electric field resistance between the main write bit line and other node or between the main write bit lines, efficiently in a short time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin-film magnetic memory device comprising:
    a memory array including a plurality of memory cells arranged in rows and columns,
    each of said memory cells having an electric resistance varying in accordance with storage data magnetically written by first and second data write currents;
    a plurality of write digit lines provided corresponding to memory cell rows, respectively, and each being activated to pass said first data write current in the row direction;
    a plurality of write bit lines provided corresponding to memory cell columns, respectively, and each being activated to pass said second data write current in the column direction;
    a plurality of word lines provided corresponding to said memory cell rows for activating a selected row including the memory cell selected as a data read target, respectively; and
    a row selecting portion for executing the row selection in said memory array, wherein
    said row selecting portion includes:
    a row decode circuit for decoding a row address,
    a plurality of word line select circuits provided corresponding to said word lines, respectively, each for activating corresponding one of said word lines based on results of decoding of the corresponding memory cell row in a data read operation, and
    a plurality of write digit line select circuits provided corresponding to said write digit lines, respectively, each for activating corresponding one of said write digit lines based on said results of decoding of said corresponding memory cell rows in a data write operation, wherein said thin-film magnetic memory device further comprises:

a plurality of main word lines each arranged for the memory cell rows of L (L: natural number more than one) in number and being selectively activated in accordance with said row address;

select lines transmitting signals for selecting one of the memory cell rows of L in number corresponding to the one main word line in accordance with said row address; and sub-word drivers each provided corresponding to the one word line and the one write digit line in common, for transmitting said results of decoding to corresponding one of said word lines and corresponding one of said write digit lines in accordance with corresponding one of said main word line and said select lines.

2. The thin-film magnetic memory device according to claim 1, wherein said word line select circuits and said write digit line select circuits for the respective memory cell rows are arranged alternatively to each other in a first region corresponding to ends on one side of said word lines and said write digit lines or in a second region corresponding to the other ends of said word lines and said write digit lines.

3. The thin-film magnetic memory device according to claim 1, further comprising:

transistor switches provided corresponding to said word lines, respectively, each for fixing corresponding one of said word lines to a ground voltage in said data write operation.

4. The thin-film magnetic memory device according to claim 1, wherein each of said sub-word drivers sets an internal node at a first voltage when one of the corresponding one word line and the corresponding one write digit line is selected based on said results of decoding, and sets said internal node at a second voltage when neither of the corresponding one word line and the corresponding one write digit line is selected based on said results of decoding;

each of said write digit line select circuits includes a first transistor switch arranged between one end of the corresponding write digit line and said internal node, and being turned on in said data write operation; and said thin-film magnetic memory device further comprises second transistor switches provided for said write digit lines, respectively, each for connecting the other end of corresponding one of said write digit lines to said second voltage.

5. A thin-film magnetic memory device comprising:

a memory array including a plurality of memory cells arranged in rows and columns, and divided into a plurality of blocks in a row direction, each of said memory cells having an electric resistance varying in accordance with storage data magnetically written by first and second data write currents;

a plurality of write digit lines provided corresponding to memory cell rows, respectively, and each being activated to pass said first data write current through the selected row including the memory cell selected as a data write target;

a plurality of main write bit lines each arranged for the memory cell columns of L (L: natural number more than one) in number, and each being activated to pass said second data write current therethrough; and a plurality of sub-write bit lines provided corresponding to the memory cell columns, respectively, in each of said blocks, each of said sub-write bit lines being located in a position between the corresponding memory cell and corresponding one of said main write bit line; and a plurality of connection control portions provided corresponding to said main write bit lines, respectively, in each of said blocks and each configured to control connection between corresponding one of said main write bit lines and the corresponding L sub-write bit lines, each said connection control portion operating in the block including said selected memory cell to connect the selected one of the corresponding L sub-write bit line, corresponding to said selected memory cell, to the corresponding main write bit line, and to disconnect electrically each of the others of the corresponding L sub-write bit lines from the corresponding main bit line.

6. The thin-film magnetic memory device according to claim 5, further comprising:

first and second write bit line drivers provided corresponding to one and the other ends of each of said main write bit lines, wherein said first and second write bit line drivers connect said one end and said other end to first and second voltages or to said second and first voltages in accordance with a level of write data, respectively, when corresponding one of said main write bit lines corresponds to said selected memory cell.

7. The thin-film magnetic memory device according to claim 6, wherein said first write bit line driver includes:

a first driver transistor arranged between said first voltage and one end of the corresponding main write bit line, a second driver transistor arranged between said second voltage and said one end, and a first logic gate for controlling gate voltages of said first and second driver transistors in accordance with a signal selecting the corresponding main write bit line and said write data; and said second write bit line driver includes:

a third driver transistor arranged between said first voltage and the other end of the corresponding main write bit line, a fourth driver transistor arranged between said second voltage and said other end, and a second logic gate for controlling gate voltages of said third and fourth driver transistors in accordance with said signal and an inverted signal of said write data.

8. The thin-film magnetic memory device according to claim 5, wherein each of said connection control portions connects the opposite ends of the sub-write bit line corresponding to said selected memory cell to first and second nodes on the corresponding main write bit line, respectively, and has a first select switch disposed in series between said first and second nodes; and said first select switch interrupts a current path on the corresponding main write bit line when corresponding one of said blocks includes said selected memory cell.

9. The thin-film magnetic memory device according to claim 8, wherein said connection control portion further includes:
second select switches provided corresponding to said sub-write bit lines, respectively, and each arranged between one end of corresponding one of said sub-write bit lines and said first node, and
third select switches provided corresponding to said sub-write bit lines, respectively, and each arranged between the other end of corresponding one of said sub-write bit lines and said second node; and
said second and third select switches are selectively turned on in response to a signal selecting one of the sub-write bit lines of L in number corresponding to the one main write word line when the corresponding block includes said selected memory cell.

10. The thin-film magnetic memory device according to claim 5, further comprising:

a plurality of write bit line drivers provided corresponding to one ends of said main write bit lines, respectively, each for connecting said one end of corresponding one of said main write bit lines to a first voltage when the corresponding main write bit lines correspond to the selected memory cell, respectively, wherein
each said connection control portion connects one and the other ends of the selected sub-write bit line to the corresponding main write bit line and a second voltage, or vice versa in accordance with a level of write data, respectively.

11. The thin-film magnetic memory device according to claim 10, wherein each said connection control portion includes:
first select switches provided corresponding to said sub-write bit lines, respectively, and each arranged between one end of corresponding one of said sub-write bit lines and the corresponding main write bit line, and
second select switches provided corresponding to said sub-write bit lines, respectively, and each arranged between the other end of corresponding one of said sub-write bit lines and the corresponding main write bit line.

12. The thin-film magnetic memory device according to claim 10, wherein each said connection control portion includes:
third select switches provided corresponding to said sub-write bit lines, respectively, and each arranged between one end of corresponding one of said sub-write bit lines and said second voltage, and
fourth select switches provided corresponding to said sub-write bit lines, respectively, and each arranged between the other end of corresponding one of said sub-write bit lines and said second voltage.

13. The thin-film magnetic memory device according to claim 10, wherein each said connection control portion includes first CMOS driver and second CMOS driver arranged corresponding to one and the other ends of each of said sub-write bit lines, respectively,
said first CMOS driver includes:
a first MOS transistor of a first conductivity type arranged between one end of corresponding one of said sub-write bit lines and the corresponding main write bit line, and
a second MOS transistor having a second conductivity type opposite to said first conductivity type and arranged between said one end and said second voltage;
said second CMOS driver includes:
a third MOS transistor of said first conductivity type arranged between the other end of corresponding one of said sub-write bit lines and the corresponding main write bit line, and
a fourth MOS transistor of said second conductivity type arranged between said other end and said second voltage; and
said first and second MOS transistors are turned on complementarily to each other, and said third and fourth MOS transistors are turned on complementarily to each other.

14. A thin-film magnetic memory device comprising:

a memory cell array including a plurality of memory cells arranged in rows and columns, and each said memory cell having an electric resistance varying in accordance with storage data magnetically written by first and second data write currents;
a plurality of write digit lines provided corresponding to memory cell rows, respectively, and each being activated to pass said first data write current in a row direction;
a plurality of write bit lines provided corresponding to memory cell columns, respectively, and each being activated to pass said second data write current in a column direction;
a plurality of word lines provided corresponding to said memory cell rows, respectively, and each being activated to pass a data read current through the corresponding memory cells; and
a multi-selection control portion for activating at least two of said write digit lines, at least two of said write bit lines, and/or at least two of said word lines, in parallel in an operation test.

15. The thin-film magnetic memory device according to claim 14, wherein, said multi-selection control portion activates at least two of said write digit lines in parallel in an operation test.

16. The thin-film magnetic memory device according to claim 15, further comprising:

a test current supply circuit for lowering said first data write current to a level theoretically disabling data writing into each memory cell in said operation test.

17. The thin-film magnetic memory device according to claim 14, wherein, said multi-selection control portion activates at least two of said write bit lines in parallel in an operation test.

18. The thin-film magnetic memory device according to claim 14, wherein, said multi-selection control portion activates at least two of said word lines in parallel in an operation test.

* * * * *